(12) United States Patent
Brown et al.

(10) Patent No.: US 7,628,617 B2
(45) Date of Patent: Dec. 8, 2009

(54) STRUCTURE AND PROCESS FOR A CONTACT GRID ARRAY FORMED IN A CIRCUITIZED SUBSTRATE

(75) Inventors: Dirk D. Brown, Mountain View, CA (US); John D. Williams, Sunnyvale, CA (US); William B. Long, Sunnyvale, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 11/525,755

(22) Filed: Sep. 22, 2006

(65) Prior Publication Data

US 2007/0218710 A1    Sep. 20, 2007

Related U.S. Application Data

(63) Continuation-in-part of application No. 10/460,497, filed on Jun. 11, 2003, now Pat. No. 7,113,408, and a continuation-in-part of application No. 11/445,272, filed on Jun. 2, 2006, and a continuation-in-part of application No. 11/445,285, filed on Jun. 2, 2006, now abandoned.

(51) Int. Cl.
    *H01R 12/00* (2006.01)
(52) U.S. Cl. ........................................ 439/66
(58) Field of Classification Search ............... 439/66, 439/68, 69, 70, 71, 74
    See application file for complete search history.

(56) References Cited

U.S. PATENT DOCUMENTS

| 3,543,587 A | 12/1970 | Kawada |
| 3,634,807 A | 1/1972 | Grobe et al. |
| 3,670,409 A | 6/1972 | Reimer |
| 4,087,146 A | 5/1978 | Hudson, Jr. |
| 4,175,810 A | 11/1979 | Holt et al. |
| 4,548,451 A | 10/1985 | Benarr et al. |
| 4,592,617 A | 6/1986 | Seidler |
| 4,657,336 A | 4/1987 | Johnson et al. |
| 4,734,053 A | 3/1988 | Imai |
| 4,790,777 A | 12/1988 | Iimori et al. |

(Continued)

FOREIGN PATENT DOCUMENTS

EP    0692823 A1    1/1996

(Continued)

OTHER PUBLICATIONS

Kromann, Gary B., et al., "Motorola's PowerPC 603 and PowerPC 604 RISC Microprocessor: the C4/Cermanic-ball-grid Array Interconnect Technology", *Motorola Advanced Packaging Technology*, Motorola Inc.,(1996),1-10 Pgs.

(Continued)

*Primary Examiner*—Ross N Gushi

(57) ABSTRACT

An elastic contact array circuitized substrate includes a circuitized substrate provided with circuit traces, and an array of three dimensional contact elements joined to the circuitized substrate and electrically coupled to the circuit traces. In one configuration, the array of three dimensional contacts are formed in a spring sheet material having anisotropic grains whose long direction is selected with respect to the longitudinal direction of elastic contact arms, in accordance with desired properties. In another configuration of the invention, the circuit traces are formed integrally within the spring sheet material.

18 Claims, 31 Drawing Sheets

U.S. PATENT DOCUMENTS

| | | | |
|---|---|---|---|
| 4,893,172 A | 1/1990 | Matsumoto et al. | |
| 4,998,885 A | 3/1991 | Beaman | |
| 5,053,083 A | 10/1991 | Sinton | |
| 5,135,403 A | 8/1992 | Rinaldi | |
| 5,148,266 A | 9/1992 | Khandros et al. | |
| 5,152,695 A | 10/1992 | Grabbe et al. | |
| 5,161,983 A | 11/1992 | Ohno et al. | |
| 5,173,055 A | 12/1992 | Grabbe | |
| 5,199,879 A | 4/1993 | Kohn et al. | |
| 5,228,861 A | 7/1993 | Grabbe | |
| 5,257,950 A | 11/1993 | Lenker et al. | |
| 5,292,558 A | 3/1994 | Heller et al. | |
| 5,299,939 A | 4/1994 | Walker et al. | |
| 5,316,496 A | 5/1994 | Imai | |
| 5,338,209 A | 8/1994 | Brooks et al. | |
| 5,358,411 A | 10/1994 | Mroczkowski et al. | |
| 5,366,380 A | 11/1994 | Reymond | |
| 5,380,210 A | 1/1995 | Grabbe et al. | |
| 5,423,687 A | 6/1995 | Laub | |
| 5,468,655 A | 11/1995 | Greer | |
| 5,483,741 A | 1/1996 | Akram et al. | |
| 5,509,814 A | 4/1996 | Mosquera | |
| 5,528,456 A | 6/1996 | Takahashi | |
| 5,530,288 A | 6/1996 | Stone | |
| 5,532,612 A | 7/1996 | Liang | |
| 5,562,487 A | 10/1996 | Ii et al. | |
| 5,575,662 A | 11/1996 | Yamamoto et al. | |
| 5,583,378 A | 12/1996 | Marrs et al. | |
| 5,590,460 A | 1/1997 | DiStefano et al. | |
| 5,593,903 A | 1/1997 | Beckenbaugh et al. | |
| 5,629,837 A | 5/1997 | Barabi et al. | |
| 5,632,631 A | 5/1997 | Fjelstad et al. | |
| 5,634,821 A | 6/1997 | Crane | |
| 5,654,231 A | 8/1997 | Liang et al. | |
| 5,691,913 A | 11/1997 | Tsuchida et al. | |
| 5,751,556 A | 5/1998 | Butler et al. | |
| 5,772,451 A | 6/1998 | Dozier, II et al. | |
| 5,791,911 A | 8/1998 | Fasano et al. | |
| 5,802,699 A | 9/1998 | Fjelstad et al. | |
| 5,812,378 A | 9/1998 | Fjelstad et al. | |
| 5,842,273 A | 12/1998 | Schar | |
| 5,860,585 A | 1/1999 | Rutledge et al. | |
| 5,896,038 A | 4/1999 | Budnaitis et al. | |
| 5,903,059 A | 5/1999 | Bertin et al. | |
| 5,906,498 A | 5/1999 | Nagafuji | |
| 5,911,597 A | 6/1999 | Oshitani | |
| 5,934,914 A | 8/1999 | Fjelstad et al. | |
| 5,938,453 A | 8/1999 | Ichimura | |
| 5,956,575 A | 9/1999 | Bertin et al. | |
| 5,967,797 A | 10/1999 | Maldonado | |
| 5,967,850 A | 10/1999 | Crane | |
| 5,980,335 A | 11/1999 | Barbieri et al. | |
| 5,981,870 A | 11/1999 | Barcley et al. | |
| 5,984,704 A | 11/1999 | Hashiguchi | |
| 5,989,994 A | 11/1999 | Khoury et al. | |
| 5,993,247 A | 11/1999 | Kidd | |
| 6,000,280 A | 12/1999 | Miller et al. | |
| 6,019,611 A | 2/2000 | McHugh et al. | |
| 6,027,366 A | 2/2000 | Mori et al. | |
| 6,029,344 A | 2/2000 | Khandros et al. | |
| 6,031,282 A | 2/2000 | Jones et al. | |
| 6,032,356 A | 3/2000 | Eldridge et al. | |
| 6,042,387 A | 3/2000 | Jonaidi | |
| 6,044,548 A | 4/2000 | Distefano et al. | |
| 6,056,572 A | 5/2000 | Matsumoto et al. | |
| 6,063,640 A | 5/2000 | Mizukoshi et al. | |
| 6,072,323 A | 6/2000 | Hembree et al. | |
| 6,083,837 A | 7/2000 | Millet | |
| 6,084,312 A | 7/2000 | Lee | |
| 6,089,904 A | 7/2000 | Wu | |
| 6,133,534 A | 10/2000 | Fukutomi et al. | |
| 6,142,789 A | 11/2000 | Nolan et al. | |
| 6,146,151 A | 11/2000 | Li | |
| 6,156,484 A | 12/2000 | Bassous et al. | |
| 6,181,144 B1 | 1/2001 | Hembree et al. | |
| 6,184,699 B1 | 2/2001 | Smith et al. | |
| 6,191,368 B1 | 2/2001 | Di Stefano et al. | |
| 6,196,852 B1 | 3/2001 | Neumann et al. | |
| 6,200,143 B1 | 3/2001 | Haba et al. | |
| 6,203,347 B1 | 3/2001 | Crane | |
| 6,204,065 B1 | 3/2001 | Ochiai | |
| 6,205,660 B1 | 3/2001 | Fjelstad et al. | |
| 6,208,157 B1 | 3/2001 | Akram et al. | |
| 6,218,848 B1 | 4/2001 | Hembree et al. | |
| 6,220,869 B1 | 4/2001 | Grant et al. | |
| 6,221,750 B1 | 4/2001 | Fjelstad | |
| 6,224,392 B1 | 5/2001 | Fasano et al. | |
| 6,250,933 B1 | 6/2001 | Khoury et al. | |
| 6,255,727 B1 | 7/2001 | Khoury | |
| 6,255,736 B1 | 7/2001 | Kaneko | |
| 6,263,566 B1 | 7/2001 | Hembree et al. | |
| 6,264,477 B1 | 7/2001 | Smith et al. | |
| 6,293,806 B1 | 9/2001 | Yu | |
| 6,293,808 B1 | 9/2001 | Ochiai | |
| 6,297,164 B1 | 10/2001 | Khoury et al. | |
| 6,298,552 B1 | 10/2001 | Li | |
| 6,300,782 B1 | 10/2001 | Hembree et al. | |
| 6,306,752 B1 | 10/2001 | DiStefano et al. | |
| 6,315,616 B1 | 11/2001 | Hayashi | |
| 6,332,801 B1 | 12/2001 | Watanbe | |
| 6,335,210 B1 | 1/2002 | Farooq et al. | |
| 6,336,269 B1 | 1/2002 | Eldridge et al. | |
| 6,337,575 B1 | 1/2002 | Akram | |
| 6,345,987 B1 | 2/2002 | Mori et al. | |
| 6,352,436 B1 | 3/2002 | Howard | |
| 6,361,328 B1 | 3/2002 | Gosselin | |
| 6,373,267 B1 | 4/2002 | Hiroi | |
| 6,374,487 B1 | 4/2002 | Haba et al. | |
| 6,375,474 B1 | 4/2002 | Harper, Jr. et al. | |
| 6,384,475 B1 | 5/2002 | Beroz et al. | |
| 6,392,524 B1 | 5/2002 | Biegelsen et al. | |
| 6,392,534 B1 | 5/2002 | Flick | |
| 6,397,460 B1 | 6/2002 | Hembree | |
| 6,399,900 B1 | 6/2002 | Khoury et al. | |
| 6,402,526 B1 | 6/2002 | Schreiber et al. | |
| 6,409,521 B1 | 6/2002 | Rathburn | |
| 6,420,661 B1 | 7/2002 | Di Stefano et al. | |
| 6,420,789 B1 | 7/2002 | Tay et al. | |
| 6,420,884 B1 | 7/2002 | Khoury et al. | |
| 6,428,328 B2 | 8/2002 | Haba et al. | |
| 6,431,881 B1 | 8/2002 | Engbring et al. | |
| 6,436,802 B1 | 8/2002 | Khoury | |
| 6,437,591 B1 | 8/2002 | Farnworth et al. | |
| 6,442,039 B1 | 8/2002 | Schreiber | |
| 6,447,305 B1 | 9/2002 | Roberts | |
| 6,452,407 B2 | 9/2002 | Khoury et al. | |
| 6,454,573 B2 | 9/2002 | Hayashi et al. | |
| 6,461,892 B2 | 10/2002 | Beroz | |
| 6,465,748 B2 | 10/2002 | Yamanashi et al. | |
| 6,472,890 B2 | 10/2002 | Khoury et al. | |
| 6,474,997 B1 | 11/2002 | Ochiai | |
| 6,492,251 B1 | 12/2002 | Haba et al. | |
| 6,497,581 B2 * | 12/2002 | Slocum et al. | 439/66 |
| 6,517,362 B2 | 2/2003 | Hirai et al. | |
| 6,520,778 B1 | 2/2003 | Eldridge et al. | |
| 6,524,115 B2 | 2/2003 | Gates et al. | |
| 6,551,112 B1 | 4/2003 | Li et al. | |
| 6,558,187 B2 | 5/2003 | Aoki | |
| 6,576,485 B2 | 6/2003 | Zhou et al. | |
| 6,577,003 B1 | 6/2003 | Crane et al. | |
| 6,604,950 B2 | 8/2003 | Maldonado et al. | |
| 6,612,861 B2 | 9/2003 | Khoury et al. | |
| 6,616,966 B2 | 9/2003 | Mathieu et al. | |
| 6,622,380 B1 | 9/2003 | Grigg | |

| | | |
|---|---|---|
| 6,627,092 B2 | 9/2003 | Clements et al. |
| 6,640,432 B1 | 11/2003 | Mathieu et al. |
| 6,661,247 B2 | 12/2003 | Maruyama et al. |
| 6,663,399 B2 | 12/2003 | Ali et al. |
| 6,664,131 B2 | 12/2003 | Jackson |
| 6,669,489 B1 | 12/2003 | Dozier, II et al. |
| 6,671,947 B2 | 1/2004 | Bohr |
| 6,672,879 B2 | 1/2004 | Neidich et al. |
| 6,677,245 B2 | 1/2004 | Zhou et al. |
| 6,692,263 B2 | 2/2004 | Villain et al. |
| 6,692,265 B2 | 2/2004 | Kung et al. |
| 6,700,072 B2 | 3/2004 | Distefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,733,326 B2 | 5/2004 | Lee |
| 6,736,664 B2 | 5/2004 | Ueda et al. |
| 6,736,665 B2 | 5/2004 | Zhou et al. |
| 6,749,459 B2 | 6/2004 | Urbaniak et al. |
| 6,750,136 B2 | 6/2004 | Zhou et al. |
| 6,750,551 B1 | 6/2004 | Frutschy et al. |
| 6,763,581 B2 | 7/2004 | Hirai et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,821,129 B2 | 11/2004 | Tsuchiya |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,857,880 B2 | 2/2005 | Ohtsuki et al. |
| 6,869,290 B2 | 3/2005 | Brown et al. |
| 6,869,307 B2 | 3/2005 | Endo |
| 6,881,070 B2 | 4/2005 | Chiang |
| 6,887,085 B2 | 5/2005 | Hirai |
| 6,898,580 B1 | 5/2005 | Curran et al. |
| 6,898,773 B1 | 5/2005 | Teig et al. |
| 6,902,425 B2 | 6/2005 | Huang |
| 6,916,181 B2 | 7/2005 | Brown et al. |
| 6,920,689 B2 | 7/2005 | Khandros et al. |
| 6,923,656 B2 | 8/2005 | Novotny et al. |
| 6,926,536 B2 | 8/2005 | Ochiai |
| 6,939,143 B2 | 9/2005 | Rathburn |
| 6,957,963 B2 | 10/2005 | Rathburn |
| 6,960,924 B2 | 11/2005 | Akram |
| 6,976,888 B2 | 12/2005 | Shirai et al. |
| 6,980,017 B1 | 12/2005 | Farnworth et al. |
| 6,995,557 B2 | 2/2006 | Goldfine et al. |
| 6,995,577 B2 | 2/2006 | Farnworth et al. |
| 7,001,208 B2 | 2/2006 | Huang |
| 7,002,362 B2 | 2/2006 | Farnworth et al. |
| 7,004,775 B1 | 2/2006 | Sakurai et al. |
| 7,009,413 B1 | 3/2006 | Alghouli |
| 7,021,941 B1 | 4/2006 | Chuang et al. |
| 7,021,970 B2 | 4/2006 | Ozai |
| 7,025,601 B2 | 4/2006 | Dittmann |
| D521,455 S | 5/2006 | Radza |
| D521,940 S | 5/2006 | Radza |
| 7,048,548 B2 | 5/2006 | Mathieu et al. |
| 7,053,482 B2 | 5/2006 | Cho |
| D522,461 S | 6/2006 | Radza |
| D522,972 S | 6/2006 | Long et al. |
| 7,056,131 B1 | 6/2006 | Williams |
| 7,063,560 B2 | 6/2006 | Asao |
| D524,756 S | 7/2006 | Radza |
| 7,070,419 B2 | 7/2006 | Brown et al. |
| 7,074,074 B2 | 7/2006 | Zhang et al. |
| 7,083,425 B2 | 8/2006 | Chong et al. |
| 7,086,869 B1 | 8/2006 | Dangler et al. |
| 7,090,503 B2 | 8/2006 | Dittmann |
| 7,097,496 B2 | 8/2006 | Zhang et al. |
| 7,112,089 B1 | 9/2006 | Liu et al. |
| 7,114,961 B2 | 10/2006 | Williams |
| 7,140,883 B2 | 11/2006 | Khandros et al. |
| 7,189,090 B2 | 3/2007 | Aizawa et al. |
| 7,210,942 B2 | 5/2007 | Uchida et al. |
| 7,238,044 B2 | 7/2007 | Uchida et al. |
| 7,244,125 B2 | 7/2007 | Brown et al. |
| 7,252,540 B2 | 8/2007 | Tanaka |
| 7,261,569 B2 | 8/2007 | Uchida et al. |
| 7,261,595 B2 | 8/2007 | Shino |
| 7,263,771 B2 | 9/2007 | Ochiai |
| 7,285,015 B2 | 10/2007 | Helbok et al. |
| 7,371,073 B2 | 5/2008 | William |
| 2001/0001080 A1 | 5/2001 | Eldridge et al. |
| 2001/0024890 A1 | 9/2001 | Maruyama et al. |
| 2002/0006744 A1 | 1/2002 | Tashiro |
| 2002/0008966 A1 | 1/2002 | Fjelstad et al. |
| 2002/0011859 A1 | 1/2002 | Smith et al. |
| 2002/0055282 A1 | 5/2002 | Eldridge et al. |
| 2002/0055289 A1 | 5/2002 | Murakami et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129866 A1 | 9/2002 | Czebatul et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0178331 A1 | 11/2002 | Beardsley et al. |
| 2002/0179331 A1 | 12/2002 | Brodsky et al. |
| 2003/0000739 A1 | 1/2003 | Frutschy et al. |
| 2003/0003779 A1 | 1/2003 | Rathburn |
| 2003/0022503 A1 | 1/2003 | Clements et al. |
| 2003/0035277 A1 | 2/2003 | Saputro et al. |
| 2003/0049951 A1 | 3/2003 | Eldridge et al. |
| 2003/0064635 A1 | 4/2003 | Ochiai |
| 2003/0089936 A1 | 5/2003 | McCormack et al. |
| 2003/0092293 A1 | 5/2003 | Ohtsuki et al. |
| 2003/0096512 A1 | 5/2003 | Cornell |
| 2003/0099097 A1 | 5/2003 | Mok et al. |
| 2003/0129866 A1 | 7/2003 | Romano et al. |
| 2003/0147197 A1 | 8/2003 | Uriu et al. |
| 2003/0194832 A1 | 10/2003 | Lopata et al. |
| 2004/0029411 A1 | 2/2004 | Rathburn |
| 2004/0033717 A1 | 2/2004 | Peng |
| 2004/0072456 A1* | 4/2004 | Dozier et al. ................ 439/83 |
| 2004/0072467 A1 | 4/2004 | Jordan et al. |
| 2004/0118603 A1 | 6/2004 | Chambers |
| 2004/0127073 A1 | 7/2004 | Ochiai |
| 2005/0088193 A1 | 4/2005 | Haga |
| 2005/0099193 A1 | 5/2005 | Burgess |
| 2005/0142900 A1 | 6/2005 | Boggs et al. |
| 2005/0164527 A1 | 7/2005 | Radza et al. |
| 2005/0167816 A1 | 8/2005 | Khandros et al. |
| 2005/0208788 A1 | 9/2005 | Dittmann |
| 2005/0287828 A1 | 12/2005 | Stone et al. |
| 2006/0028222 A1 | 2/2006 | Farnworth et al. |
| 2006/0113107 A1 | 6/2006 | Williams |
| 2007/0054515 A1 | 3/2007 | Williams |
| 2007/0054544 A1 | 3/2007 | Hirata |
| 2007/0054545 A1 | 3/2007 | Takahira |
| 2007/0105433 A1 | 5/2007 | Shioda et al. |
| 2007/0123074 A1 | 5/2007 | Nishimura |
| 2007/0141863 A1 | 6/2007 | Williams |
| 2007/0178751 A1 | 8/2007 | Yamamoto |
| 2007/0275579 A1 | 11/2007 | Si et al. |
| 2008/0045076 A1 | 2/2008 | Dittmann et al. |
| 2008/0050958 A1 | 2/2008 | Hashiguchi et al. |
| 2008/0076282 A1 | 3/2008 | Yamaji et al. |

FOREIGN PATENT DOCUMENTS

| | | |
|---|---|---|
| EP | 1280241 A1 | 1/2003 |
| EP | 1005086 B1 | 9/2003 |

| | | |
|---|---|---|
| EP | 0839321 B1 | 1/2006 |
| JP | 2000-114433 | 4/2000 |
| JP | 2001-203435 | 7/2001 |
| WO | WO-1996002068 A1 | 1/1996 |
| WO | WO-199743653 A1 | 11/1997 |
| WO | WO-1997044859 A1 | 11/1997 |
| WO | WO-2002013253 A1 | 2/2002 |
| WO | WO-2005034296 A1 | 4/2005 |
| WO | WO-2005036940 A1 | 4/2005 |
| WO | WO-2005067361 A1 | 7/2005 |
| WO | WO-2007/143115 | 12/2007 |
| WO | WO-2007143115 A2 | 12/2007 |

OTHER PUBLICATIONS

Mahajan, Ravi et al., "Emerging Directions for packaging Technologies", *Intel Technology Journal,* vol. 6, Issue 2, (May 16, 2002),62-75 Pgs.

Williams, John D., "Contact Grid Array System", *Patented Socketing System for the BGA/CSP Technology,* E-tec Interconnect Ltd.,(Jun. 2006),1-4 Pgs.

\* cited by examiner

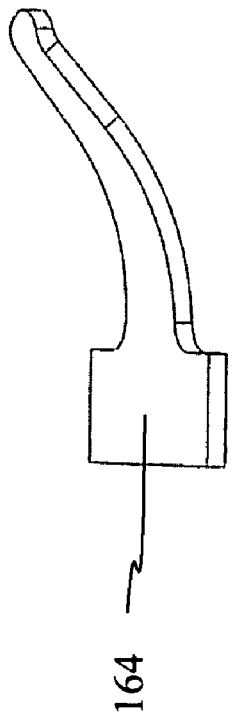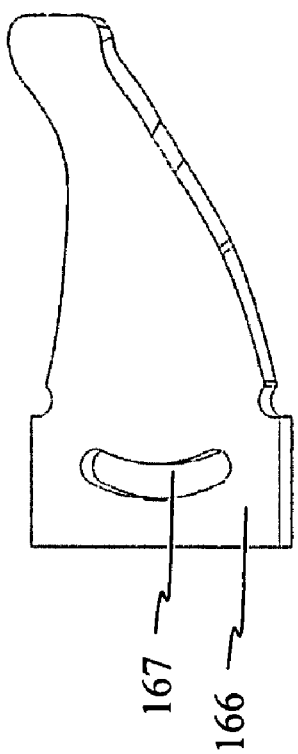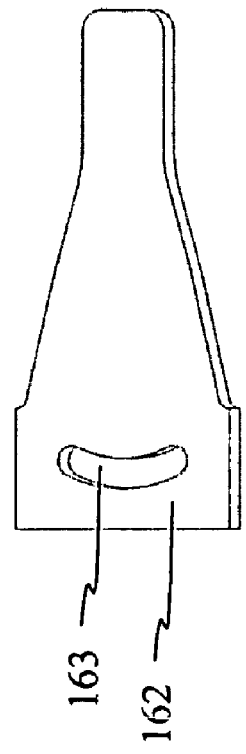
Figure 4C
Figure 4D
Figure 4A
Figure 4B

FIG. 6G1

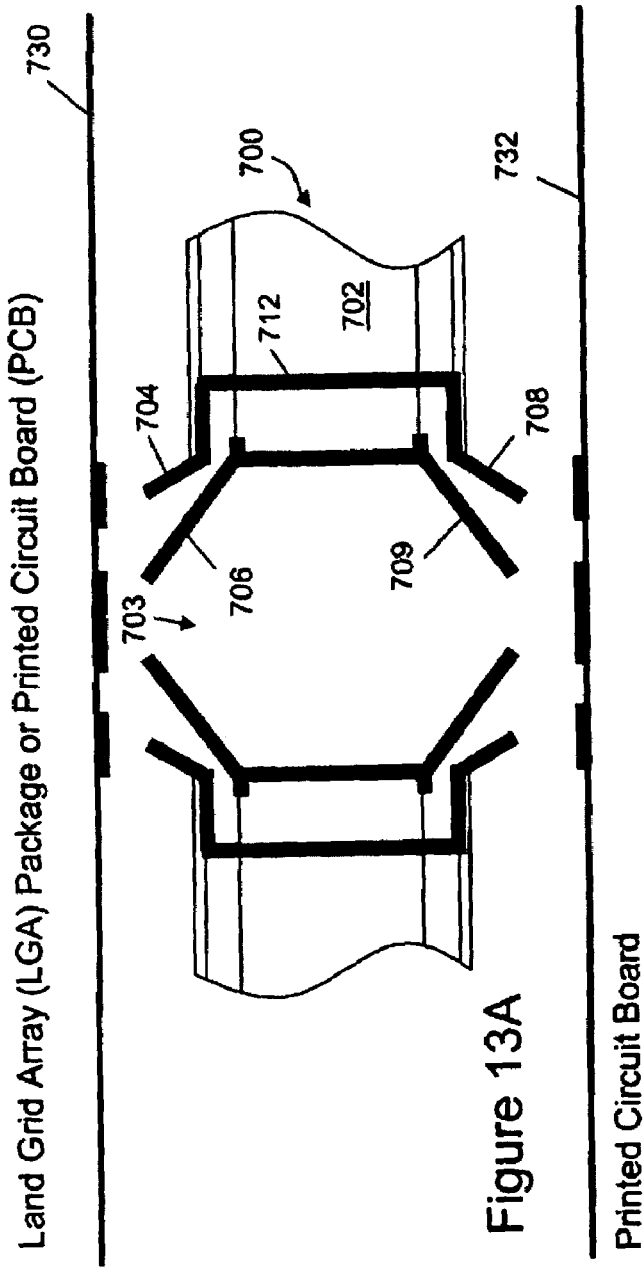
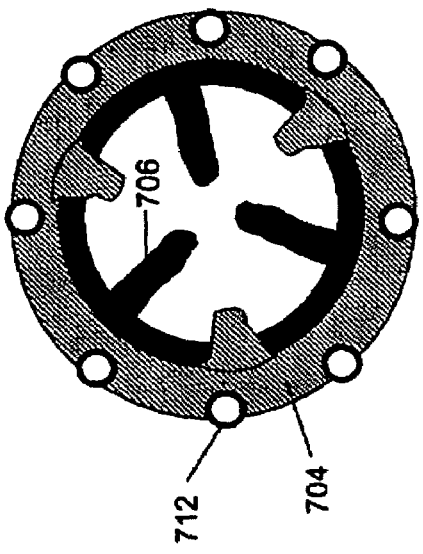
Figure 13A
Figure 13B

STRUCTURE AND PROCESS FOR A CONTACT GRID ARRAY FORMED IN A CIRCUITIZED SUBSTRATE

This is a continuation-in-part of and claims priority to U.S. patent application Ser. No. 10/460,497, filed Jun. 11, 2003 now U.S Pat. No. 7,113,408, entitled "Contact Grid Array Formed On A Printed Circuit Board"; Ser. No. 11/445,272, filed Jun. 2, 2006, entitled "A Method for Fabricating A Contact Grid Array" and Ser. No. 11/445,285, filed Jun. 2, 2006 now abandoned, entitled "A Contact Grid Array System" both of the latter two applications are continuations in part of U.S. Pat. No. 7,056,131 B1 issued Jun. 6, 2006, This continuation-in-part also claims priority to U.S. patent application Ser. No. 11/265,205, filed Nov. 3, 2005, entitled "Electrical Connector on a Flexible Carrier" which will issue on Oct. 3, 2006 as U.S. Pat. No. 7,114,961; and priority to the child Divisional application Ser. No. 11/491,160, filed Jul. 24, 2006, entitled "Electrical Connector on a Flexible Carrier" of U.S. patent application Ser. No. 11/265,205, all applications currently pending, which applications and patent are herein incorporated by reference in their entirety.

BACKGROUND

1. Field of the Invention

The invention relates to a printed circuit board including an area array of LGA contact elements formed thereon and, in particular, to a printed circuit board including a reconnectable, remountable contact grid array.

2. Background of the Invention

Electrical interconnects or connectors are used to connect two or more electronic components together or to connect an electronic component to a piece of electrical equipment, such as a tester. For instance, an electrical interconnect is typically used to connect an electronic component, such as an integrated circuit (an IC or a chip), to a printed circuit broad. An electrical interconnect is also used during integrated circuit manufacturing for connecting an IC device under test to a test system. In some applications, the electrical interconnect or connector provides separable or remountable connection so that the electronic component attached thereto can be removed and reattached. For example, it may be desirable to mount a packaged microprocessor chip to a personal computer mother board using a separable interconnect device so that malfunctioning chips can be readily removed or upgraded chips can be readily installed.

Similarly, it may be desirable to provide a separable or remountable connection on a printed circuit board (PCB), which typically includes electronic components mounted thereon.

BRIEF DESCRIPTION OF THE DRAWINGS

FIGS. 4A and 4B are schematic perspective views that illustrate exemplary two dimensional contact structures.

FIGS. 4C and 4D are schematic perspective views that illustrate exemplary three dimensional contact structures corresponding to two dimensional structures shown in FIGS. 4A and 4B, respectively

FIGS. 6G and 6G1 illustrate a cross-sectional micrograph and schematic cross-section, respectively, of a contact structure arranged in accordance with a configuration of the present invention.

FIG. 13A is a cross-sectional view of a connector including a coaxial contact element according to one configuration of the present invention.

FIG. 13B is a top view of the coaxial contact elements of FIG. 13A.

DETAILED DESCRIPTION OF THE INVENTION

In the description to follow, aspects of the present invention are illustrated with reference to printed circuit boards that incorporate elastic contact arrays during fabrication of the printed circuit boards. However, the invention encompasses fabrication of elastic contact arrays in other insulating substrates that contain electrical circuitry, as will be apparent in the discussion. The term, "circuitized substrate," as used herein, refers to any insulating substrate that includes electrical circuitry within or on the surface of the substrate, or both. Examples of circuitized substrates are printed circuit boards, grid array connectors provided with circuitry, flexible substrates containing circuitry, and electronic device packages. As used herein, the term "elastic contact array PCB" refers to a printed circuit board that contains an array of elastic contacts that is formed integrally during the process of forming the printed circuit board. For example, in an elastic contact array PCB, all or part of the elastic contact array may be laminated to a printed circuit board substrate and subsequently subjected to further processing before assembly of electronic components of the printed circuit board. In one specific example, the conductive layer used to form the elastic contact array may also be used to form PCB circuitry. In a further example, a layer containing elastic contacts may be laminated within a multilayer stack of insulating cores that comprise a PCB substrate.

Figure 1A:
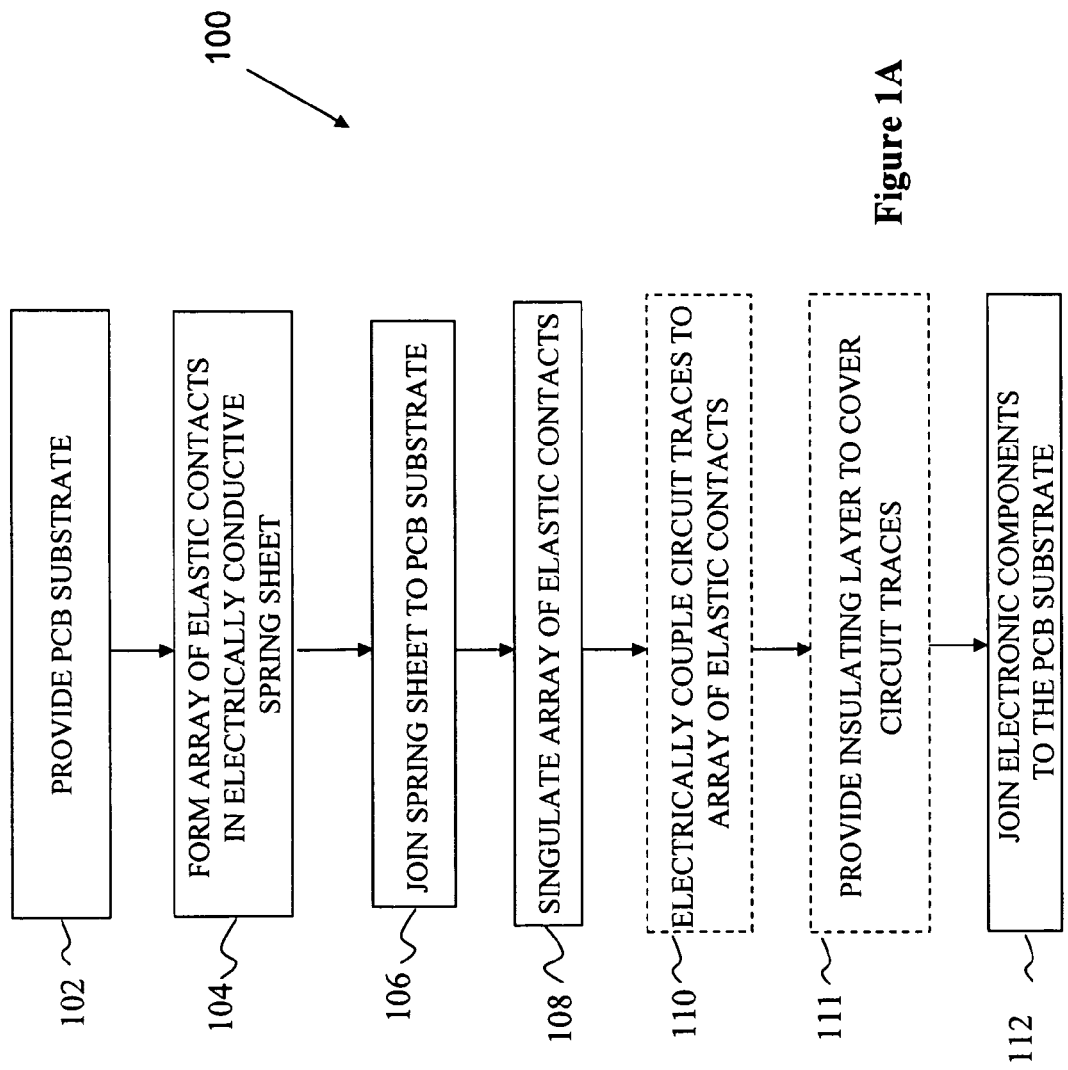
FIG. 1A is a flow chart that illustrates exemplary steps involved in a method for formation of a PCB substrate having an integrated elastic contact array, according to one aspect of the present invention.

FIG. 1A illustrates exemplary steps involved in a method 100 for formation of an elastic contact array PCB substrate, according to one aspect of the present invention. Although the formation of the elastic contact array illustrated in FIG. 1A is on a PCB substrate, the same process can be used to form an elastic contact array on any circuitized substrate. For example, the process illustrated in FIG. 1A can be used to form an elastic contact array on a flexible substrate containing circuitry, a ceramic or organic electronic device package, or any other circuitized substrate. The elastic contact array includes a plurality of elastic contacts that are configured to reversibly engage an external component electrically. The elastic contacts are each provided with at least one elastic portion that can undergo elastic deformation (reversible displacement) while engaging an external component, such as a conductive portion of the external component. The term "integrated elastic contact array" as used herein, generally refers to an elastic contact array that is formed on or within a PCB board prior to the completion of the formation process of the PCB board. The elastic contacts are typically springs, but may be arranged in other configurations. The terms PCB board and PCB substrate are both used herein to refer to the insulating substrate that is used to form a printed circuit board, as well as a printed circuit board in any stage of assembly that can include, for example, circuit traces, elastic contacts, and surface mounted electronic components.

In one exemplary aspect, prior to assembly of electrical or electronic components on the surface of a PCB board, an elastic contact array may be formed on a PCB substrate that is provided with contact regions that electrically couple to the contact array. The processes and steps described herein are generally compatible with assembly of electronic components and other features of a PCB subsequent to formation of the electrical contacts.

In step 102, a PCB substrate is provided to which a conductive spring sheet is to be joined. As used herein, the terms "conductive spring sheet" or "spring sheet" refer to a layer of conductive material, such as a metal, that is suitable for fabrication of three dimensional elastic contacts therein. In one variant, the PCB substrate is provided with conductive circuit traces, at least some of which lead to an array of contact points. The array of contact points is configured to provide electrical connection to a corresponding array of elastic contacts in the elastic spring sheet. The array of contact points may simply be an array of terminal portions of circuit paths. The array of contact points may alternatively be an array of contact pads arranged at terminal portions of circuit traces. Alternatively, or additionally, conductive circuit traces can be formed on the PCB at a later stage of processing.

In step 104, an array of elastic contacts is formed within an electrically conductive sheet material ("spring sheet").

In step 106, the spring sheet is joined with the PCB substrate. The joining of the spring sheet and the PCB substrate can involve, for example, bringing the PCB substrate into contact with the spring sheet and applying pressure to join the spring sheet and PCB substrate.

In order to facilitate joining, an adhesive layer can be provided that is disposed between the PCB substrate and spring sheet. After bringing together the PCB substrate and spring sheet, and applying heat and/or pressure, the adhesive material can remain as an interlayer lying between and bonded to at least portions of the PCB substrate and spring sheet. For example, 200 PSI of pressure can be applied at 360 degrees Fahrenheit to enable a good adhesive bond using standard adhesive materials.

Alternatively, joining of the PCB substrate and spring sheet can involve bringing the PCB substrate and spring sheet together such that portions of the spring sheet are brought into contact with electrically conductive portions of the PCB substrate, such as contact pads. Subsequently, heat and/or pressure can be applied to cause intermixing of the metallic material in the contact pads and spring sheet material to form a mechanical and/or metallurgical bond between the contact pads and spring sheet. In one example, a solder material is provided on the contact pads, spring sheet, or both surfaces, to facilitate the bonding process that takes place during heating and/or application of pressure.

In step 108, the array of elastic contacts is subjected to a singulation process. The singulation process serves to electrically isolate elastic contacts from each other by selectively removing portions of the spring sheet while preserving the elastic contact portions. Singulation can be achieved by etching, milling, scribing, sawing, or otherwise removing unwanted portions of the spring sheet. Chemical etching that is used in PCB processing may be used to perform singulation. After singulation, the PCB substrate contains an array of elastic contacts that include elastic contacts that are no longer connected to the spring sheet from which they are fabricated. Planar portions of the spring sheet that do not include elastic contacts may be in part or in whole removed from the PCB substrate. The process of removing unwanted material may use chemical etching.

In optional step 110 (which is shown in dashed lines to indicate it as optional), the array of elastic contacts is electrically coupled to circuit traces in the PCB substrate. The term "circuit traces" as used herein, generally refers to conductive paths that can also be provided with conductive pads and are configured to electrically couple components that come into physical contact with the circuit traces. In the context of circuit traces, the terms "in the PCB" and "in the PCB substrate" refer to circuit traces that are disposed on a top surface of a PCB substrate or embedded within a PCB substrate, or any combination of the two. The circuit traces thus may be any combination of traces that are embedded within the insulating portion of the PCB substrate, as well as traces formed on the surface of the PCB substrate. In one example, a PCB substrate can be provided with circuit traces and contact pads, and joined to a spring sheet containing elastic contacts using an insulating adhesive layer. A plating process can be subsequently used to electrically couple the elastic contacts of the spring sheet to contact pads connected to traces or directly to traces in the PCB substrate. The plated material forms in regions between the contact points and elastic contacts, such that a continuous electrical path forms between the array of elastic contacts and the array of contact pads or the ends of circuit traces.

Optionally, the PCB substrate can be provided with circuit traces during the elastic contact singulation process. In order to form circuit traces at the time of singulation of the elastic contacts, portions of the elastic sheet including the contacts to be singulated and regions to be used as traces are masked. Subsequently, an etch process can be used to remove unmasked portions of the spring sheet, resulting in an array of singulated contacts in which contacts are integrally connected to circuit traces formed from the spring sheet, as illustrated in more detail below with respect to FIGS. 6C and 6I-J.

Figure 1B:
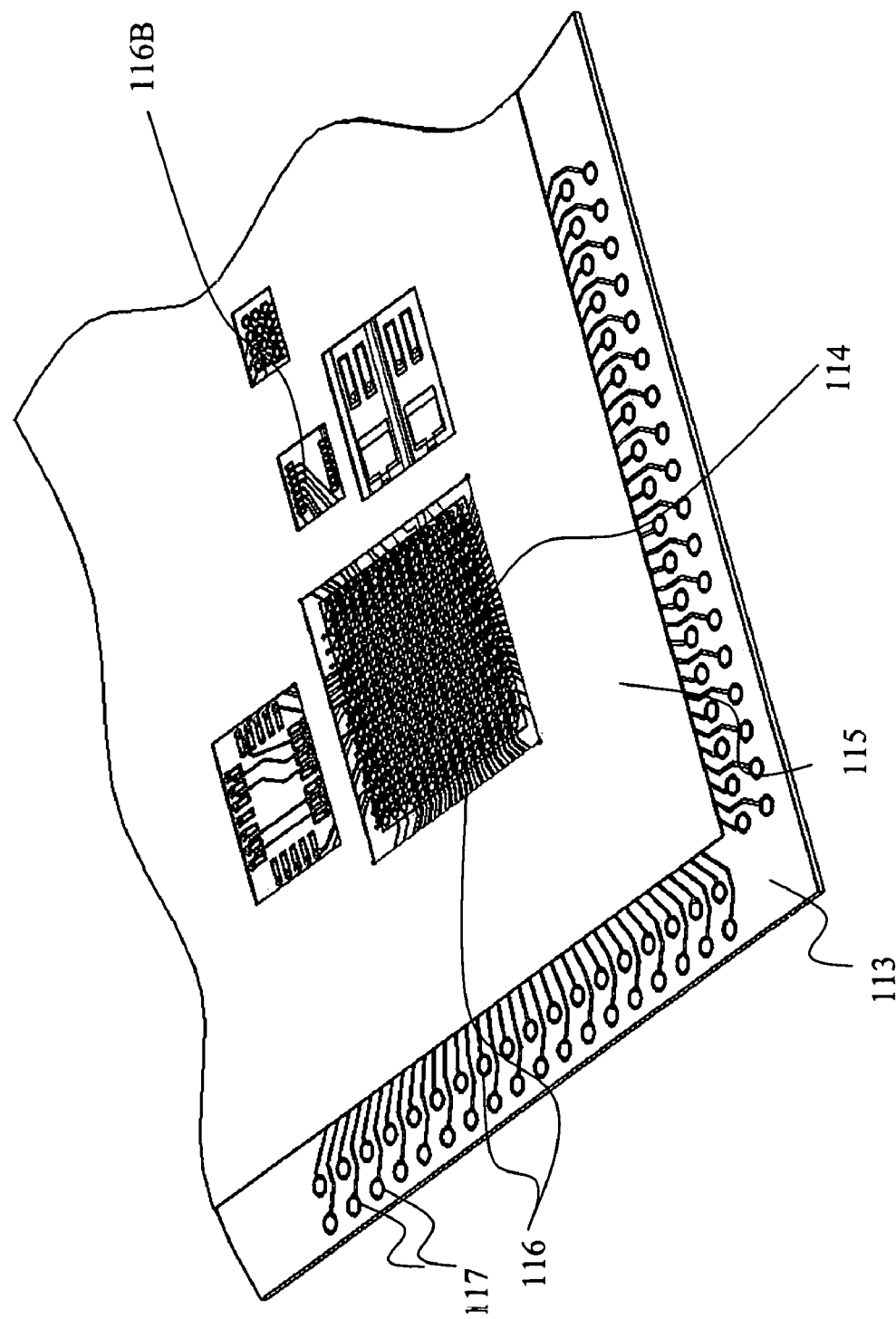
FIG. 1B is a schematic diagram that illustrates a perspective view of a PCB substrate containing an integrated elastic contact array, according to one configuration of the present invention.

In optional step 111 (which is shown in dashed lines to indicate it as optional), an insulating layer is provided to cover portions of the PCB surface. FIG. 1B illustrates a PCB substrate 113 containing an integrated elastic contact array 114 according to one configuration of the present invention. PCB substrate 113 represents an example of a substrate configuration after step 111, in which an insulating layer 115 partially covers the surface of the PCB substrate. Conductive traces 116 (partially covered by layer 115) extend from peripheral receptacles 117 to the array of elastic contacts 114. Similarly, conductive traces 116B extend from component contact pads to the array of elastic contacts.

Figure 1C:
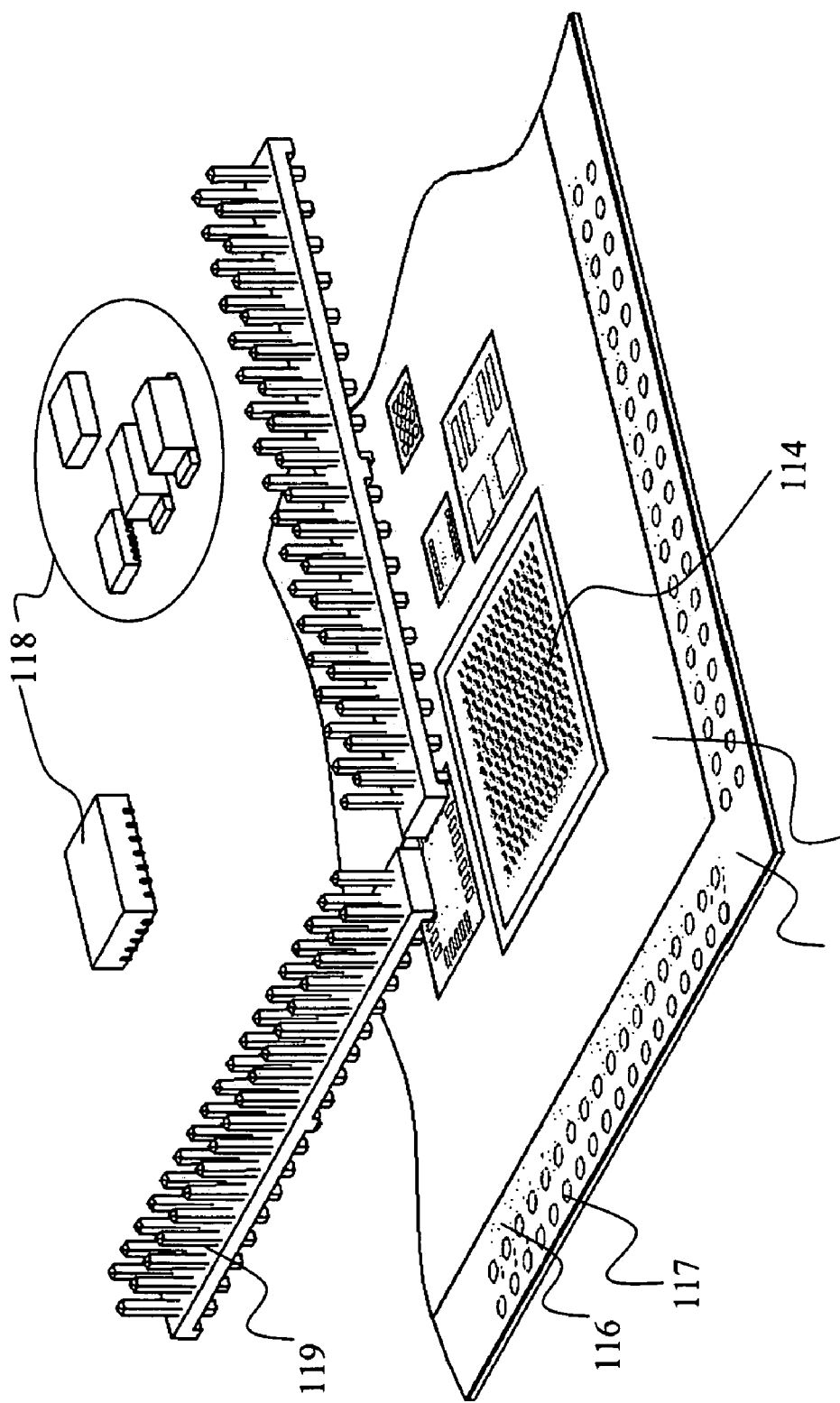
FIGS. 1C and 1D are schematic diagrams that illustrate exploded and assembled perspective views of a PCB substrate of FIG. 1B after an intermediate stage of processing, in accordance with one configuration of the present invention.
Figure 1D:
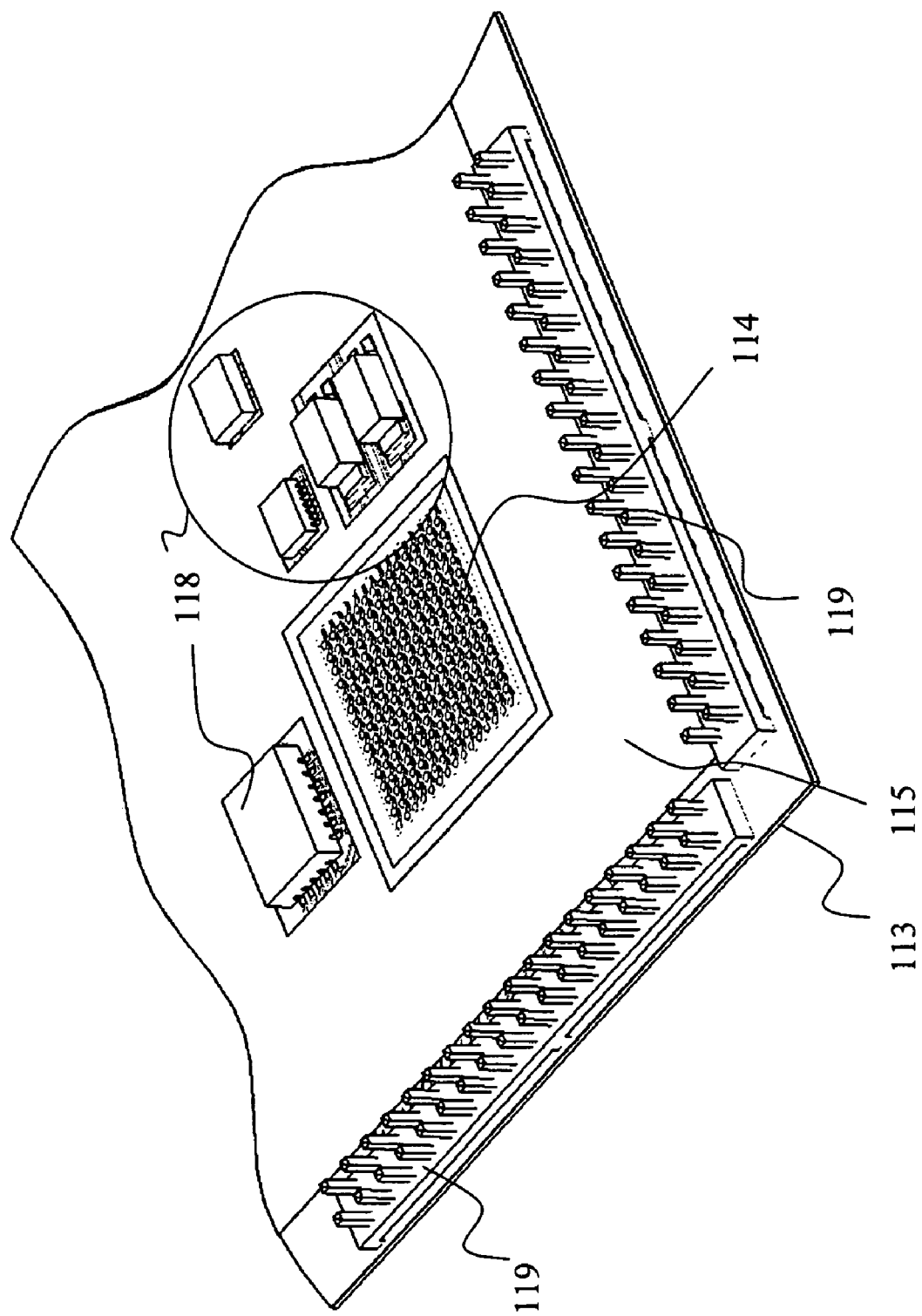

In step 112, electrical and/or electronic components are joined to the PCB substrate. FIGS. 1C and 1D illustrate exploded and assembled perspective views respectively of PCB substrate 113 of FIG. 1B after completion of step 112, in accordance with one configuration of the present invention. Components 118 and pin assemblies 119 are coupled to electrical circuits provided in PCB 113 through openings provided in insulating layer 115. PCB 113 can be reversibly connected to an external component such as an LGA using integrated elastic contact array 114.

Figure 2:
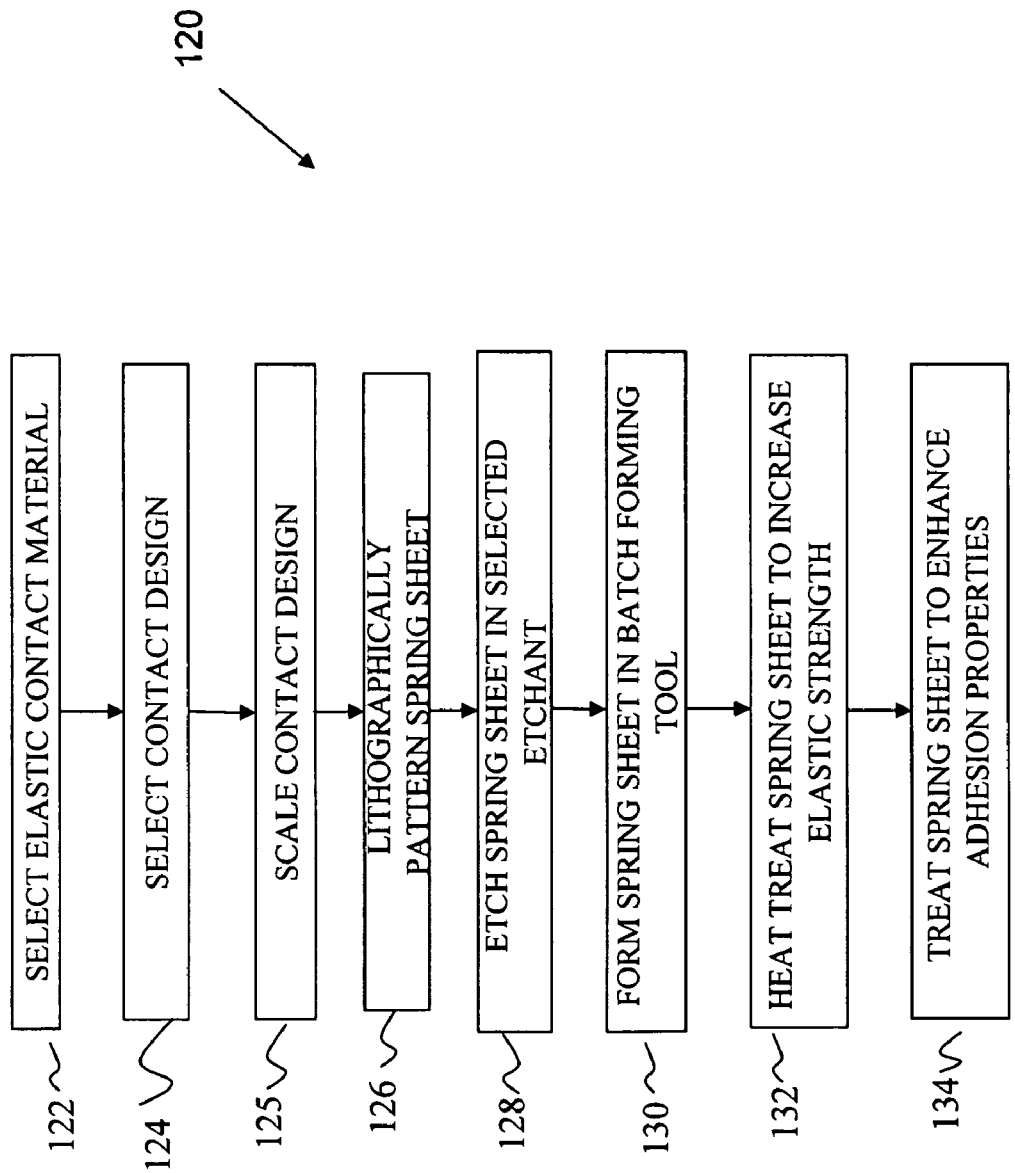
FIG. 2 is a flow chart that illustrates exemplary steps involved in a method for formation of an array of elastic contacts for joining to a PCB substrate, according to one aspect of the present invention.

FIG. 2 illustrates exemplary steps involved in a method 120 for formation of an array of elastic contacts for joining to a PCB substrate. Method 120 can comprise, for example, sub-steps of step 104 illustrated in FIG. 1.

In step 122, an elastic contact material such as Be—Cu, Spring Steel, titanium copper, phosphor bronze or any other alloy with suitable mechanical properties is selected. The selected material is then provided in the form of a spring sheet to serve as a layer from which contact elements are fabricated. The selection of material can be based on the desired application and may entail considerations of mechanical and electrical performance of contacts to be fabricated from the spring sheet, as well as process compatibilities, such as etch characteristics and formability of contacts. Optionally, the spring sheets can be heat treated prior to subsequent processing or can be treated after subsequent formation of contact elements. In one example, an alloy of copper beryllium (Cu—Be) is chosen that comprises a super-saturated solution of Be. The supersaturated solution has relatively low strength and high ductility and can readily be deformed to form elastic contact elements, such as contact arms as described further below. Subsequent to formation of contact arms, the supersaturated alloy can be treated at a temperature such that precipitation of a second phase occurs, wherein dislocations are pinned and the multiphase material imparts a high strength to the resulting contact arms.

In step 124, a contact shape is designed. The design can comprise simply selecting a known design that can be stored for use within a design program, or can entail designing contacts using computer assisted design (CAD) tools. The design can be loaded into a tool used to pattern a spring sheet to be etched to form elastic contacts. The design can be used, for example, as a mask design, to fabricate a lithography mask used to pattern a resist layer on the spring sheet with the contact design. Because the shape of contacts can be readily altered using design tools, modification of contact design can be quickly accomplished as needed.

In one variation, the contact shape design step includes the use of modeling of contact behavior. For example, an interposer designer may have certain performance criteria for a contact in mind, such as mechanical behavior. Modeling tools such as COSMOS®, produced by Structural Research and Analysis Corporation, and ANSYS,™ produced by ANSYS, Inc., can be used to model the behavior of a basic contact shape in three dimensions, aiding in selection of an overall design of contact shape and size. Once the desired contact shape and size is determined, this information can be stored as a mask design and subsequently used for patterning the spring sheet.

As part of the contact design process of step 124, the desired orientation of a contact shape with respect to a spring sheet used to form the contacts can be specified. The grain structure of metallic sheets is generally anisotropic. Contacts formed in specific alignments with respect to the grain orientation are more resilient as a spring. Consequently, contact alignment with respect to the grain orientation can be used to select the degree of resiliency desired. Accordingly, after establishing the relative grain anisotropy within a spring sheet to be used for forming contacts, the grain anisotropy can be used to select the alignment direction of longitudinal portions of an elastic contact arm design, in order to impart the desired resiliency to the contact.

In step 125, a contact design is scaled. The scaling of a design, such as a mask design, first entails determining the desired final dimensions and shape of the two dimensional contact to be fabricated. Next, the desired final dimensions are scaled to produce a scaled two dimensional design having dimensions appropriately altered (typically enlarged) to account for processing effects taking place after two dimensional patterning that affect the final contact structure obtained. In one example, once a final desired contact structure is determined, a contact design that is to be used to produce the determined contact structure in an etched spring sheet is scaled to take into account shrinkage in the spring sheet after subsequent annealing that takes place during contact fabrication.

In general, metallic sheet material provided for use as elastic contact source material is subject to a rolling process that introduces anisotropy in grain microstructure that is largest between the rolling direction and the direction orthogonal to the rolling direction. This leads to anisotropic shrinkage after annealing in the case of an alloy material that undergoes grain boundary precipitation of a phase during annealing. Even in the absence of a sheet rolling process that introduces an anisotropic grain structure, a sheet material with a uniform isotropic (within the plane of the sheet) microstructure that is subject to annealing that induces grain boundary precipitation will also experience shrinkage during the annealing. In the latter case, however, the shrinkage may be equal in the X- and Y-directions within the plane of the sheet.

Thus, either isotropic or anisotropic scaling of the reference mask design is preferable to produce a lithography mask whose dimensions are scaled to account for the shrinkage of the contacts during annealing.

Mask design scaling can be used to take into account additional effects besides the in-plane shrinkage experienced by a blanket spring sheet material. For example, pattern density of etched contacts within the spring sheet can affect the overall in-plane shrinkage. Accordingly, design scaling can be modified according to pattern density effects. In general, in a first sub-step of step 125, a two dimensional contact array design is fabricated in a spring sheet. In an experiment, the design can be fabricated in a series of spring sheets, where the sheet thickness and design density, among other things, is varied. Next, the patterned spring sheet is subject to an annealing condition or conditions to be used to harden the contacts. Subsequently, the shrinkage of the spring sheet in the X- and Y-directions is measured empirically. In an experiment, the X-Y shrinkage can be determined as a function of material, sheet thickness, pattern density, pattern shape, and annealing conditions, among other parameters. These X- and Y-scaling factors are then stored in a matrix that can include the material type, thickness, annealing condition, contact design and contact density. For example, each entry in such a matrix can contain an X- and Y-shrinkage factor that can be applied to a reference design corresponding to the desired final contact shape. For each entry, the size and shape of the reference design is then altered using a scaling function based on the X- and Y-shrinkage factors, using a CAD or similar program, to produce a final mask design.

In step 126, lithographic patterning is applied to the spring sheet. This step typically comprises the substeps of applying a lithographically sensitive film ("photoresist" or "resist"), exposing the photoresist using the artwork selected in step 124, and developing the exposed resist to leave a patterned resist layer containing openings that lie above regions of the spring sheet to be etched. In one example, the resist is applied to both sides of the spring sheet, such that the spring sheet can be patterned and etched from both sides. In this case, matching two dimensional patterns are formed on both sides of the spring sheet so that the shape and size of the feature being etched at a given horizontal position on one side of the spring sheet matches the shape and size of the feature on the other side of the spring sheet at the same horizontal position. Dry film can be used as a resist for larger feature sizes of about 1-20 mil, and liquid resist can be used for feature sizes less than about 1 mil.

In step 128, the sheets are etched in a solution, for example, one that is specifically selected for the spring sheet material being used. Cupric or Ferric Chloride etchants are commonly used in the industry for etching copper alloy and spring steels. After etching, the protective layer of resist is removed from the spring sheet in a stripping process that leaves the etched features in the spring sheet. The etched features can comprise, for example, an array of contact features that contain two dimensional arms that lie within the plane of the spring sheet.

Figure 3A:
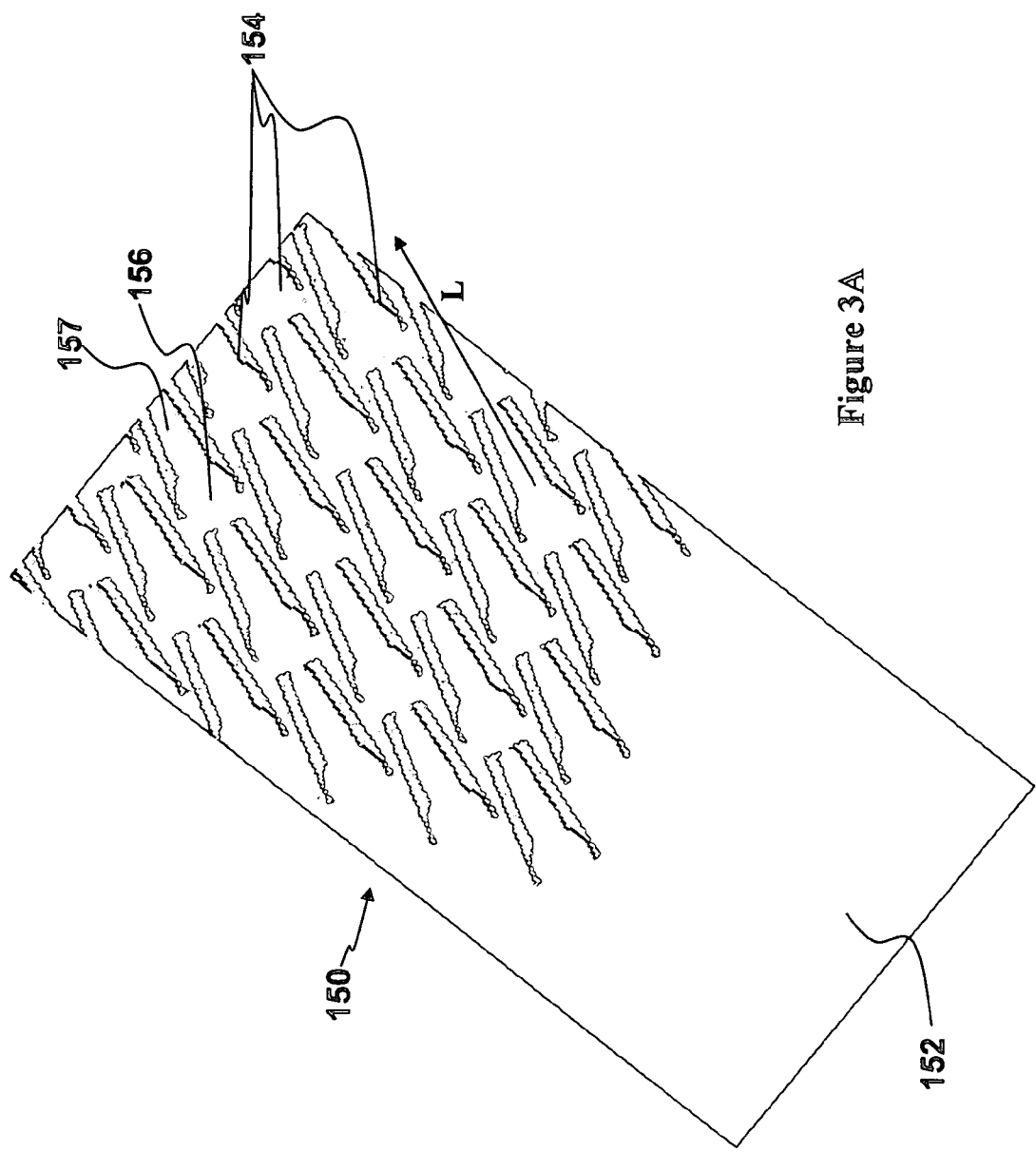
FIG. 3A is a schematic perspective view that illustrate a patterned spring sheet structure at an intermediate stage of processing, arranged in accordance with one configuration of the invention.

FIGS. 3A though 3C illustrate details of patterned contact structures, shown at various stages of processing of the spring sheet. FIG. 3A is a perspective view of a two-dimensional patterned sheet structure 150 that includes unpatterned planar portion 152 and spring contact structures 154, including base 156 and contact arm portions 157, arranged in accordance with one configuration of the invention. Two dimensional contact structures 154 are electrically connected to each other at the stage of processing illustrated in FIG. 3A.

Figure 3B:
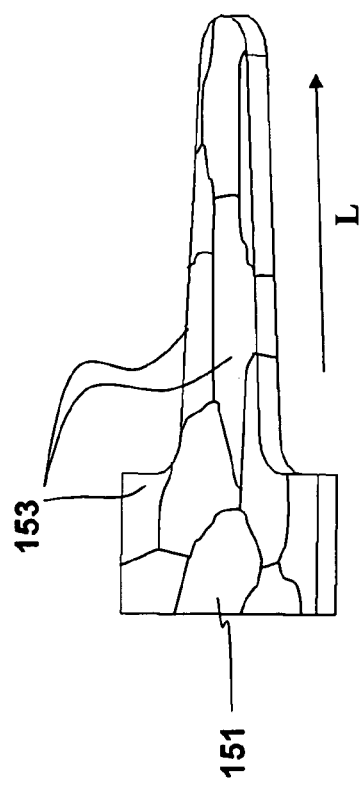
FIG. 3B is a schematic perspective view that illustrate a two dimensional contact structure formed in a pattern spring sheet at an intermediate stage of processing, arranged in accordance with one configuration of the invention.
Figure 3C:
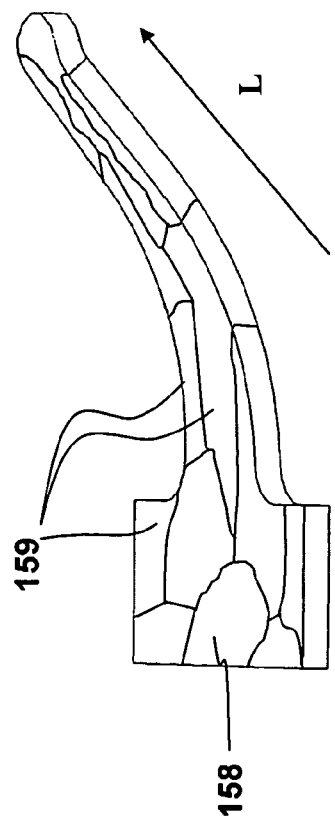
FIG. 3C s a schematic perspective view that illustrates a three dimensional contact structure formed from the structure of FIG. 3B at a subsequent processing stage, arranged in accordance with one configuration of the invention.

In one configuration of the inventions, spring sheet structure 150 comprises a plurality of grains 153, as illustrated in FIG. 3B. FIG. 3B is a perspective view of a single contact 151. Grains 153 exhibit an anisotropic shape such that a longer grain dimension is parallel to the longitudinal direction L of contact arm portions. FIG. 3C is a perspective view of a single contact 158 after undergoing formation in three dimensions, as described above. Grains 159 continue to exhibit an anisotropic shape such that a longer grain dimension is parallel to the longitudinal direction L of contact arm portions. As noted above, metallic materials prepared as sheets generally exhibit grain structure anisotropy within the plane of the sheet due to the mechanical rolling processes used to produce the sheet metal. Grains exhibit a long direction in which the grain dimension is substantially greater than the dimension in a direction orthogonal to the long direction. In addition, the long direction for grains, generally the direction of rolling, is substantially the same direction in most or substantially all of the grains within the sheet.

In accordance with configurations of the present invention, two dimensional spring sheet structures are patterned such that the long direction of the grains (roll direction) lies along a desired direction with respect to the elastic contact features in the patterned spring sheet. For example, a contact arm 158 fabricated in, a spring sheet 150 and having a longitudinal contact arm direction L that is parallel to the long direction of the grains, generally has a greater resiliency than a contact arm oriented such that the long direction of the grains is not parallel to the longitudinal direction of the contact arm. Thus, according to one aspect of the present invention, two dimensional contact arm structures, such as structures 154, are patterned such that the longitudinal contact arm direction L of the two dimensional contact arms lies parallel to the long axis of the grains in the spring sheet from which the contact arm structures are fabricated. After forming the contact arm structures into three dimensions, the resulting contact arms have higher resiliency than would corresponding three dimensional contact arms in which the long direction of the grains is not parallel to the longitudinal direction of the contact arm.

FIGS. 4A and 4B illustrate a perspective view of exemplary two dimensional contact structures (contact features) 160 and 162, respectively. It is to be noted that the two dimensional features are shown as isolated features for the purposes of clarity. However, at step 128, portions of such contact features are actually integrally connected to a spring sheet, at least in portions.

The exemplary contact shown in FIG. 4B includes a flow restrictor element 163 that provides a reservoir for adhesive layers used during bonding of the conductive spring sheet to the substrate. The reservoir is located in the base portion of contact 162 and serves to retain excess adhesive and reduce the flow of adhesive material under elastic contacts.

Referring again to FIG. 2, in step 130, a spring sheet is placed onto a batch forming tool that is configured to form the contact features into three dimensional features. The batch forming tool can be designed based on the original artwork used to define the two dimensional contact array features. For example, the batch forming tool can be a die having three dimensional features whose shape, size, and spacing are designed to match the two dimensional contact array and impart a third dimension into the contact features.

In one variation, the forming tool is fabricated using wire electrical discharge machining (EDM) or any other standard die fabrication technique.

In another variation, a male and female component of the batch forming tool is fabricated by stacking together laminated slices, for example, using stainless steel. Each slice can be patterned by etching a pattern (for example, with a laser) through the slice that matches the cross-sectional shape of a contact structure or array of contact structures, as the contacts would appear when viewed along the plane of the interposer. For example, the cross-sectional shape can be designed to match the contact array profile as viewed along an X-direction of an X-Y contact array. To define the full die structure, the pattern of each slice is varied to simulate the variation of the contact array profile in the X-direction as the Y-position is varied. After assembly, the slices would constitute a three dimensional spring die designed to accommodate the two dimensional spring sheet and compress the two dimensional contacts into a third dimension. After the spring sheet is placed in the batch forming tool, the tool acts to form the features ("flanges") in all three dimensions to produce desired contact elements. For example, by pressing the spring sheet within an appropriately designed die, the two dimensional contact arms can be plastically deformed such that they protrude above the plane of the spring sheet after removal from the die.

In order to properly match the batch forming tool to the scaled two dimensional contact pattern, the etched pattern is scaled to match the scaled two dimensional contact array structure along a first direction, such as the X-direction. Scaling of the die in the Y-direction (the direction orthogonal to the slices) can, but need not be, performed. Preferably, the X-direction in which the die dimensions are scaled represents the direction having the larger scaling factor. In some cases, the die can be designed with enough tolerance so that strict scaling in the Y-direction is not needed.

FIGS. 4C and 4D illustrate a perspective view of three dimensional formed contact structures 164 and 166, which are based on the two dimensional precursor structures of 4A and 4B, respectively. Contact structure 166 includes a flow restrictor 167, as described above with respect to FIG. 4B. It is to be noted that the three dimensional contacts are shown as isolated features for the purposes of clarity. However, at step 130, portions of such contact features are actually integrally connected to a spring sheet, at least in portions, as illustrated in FIG. 5.

Figure 5:
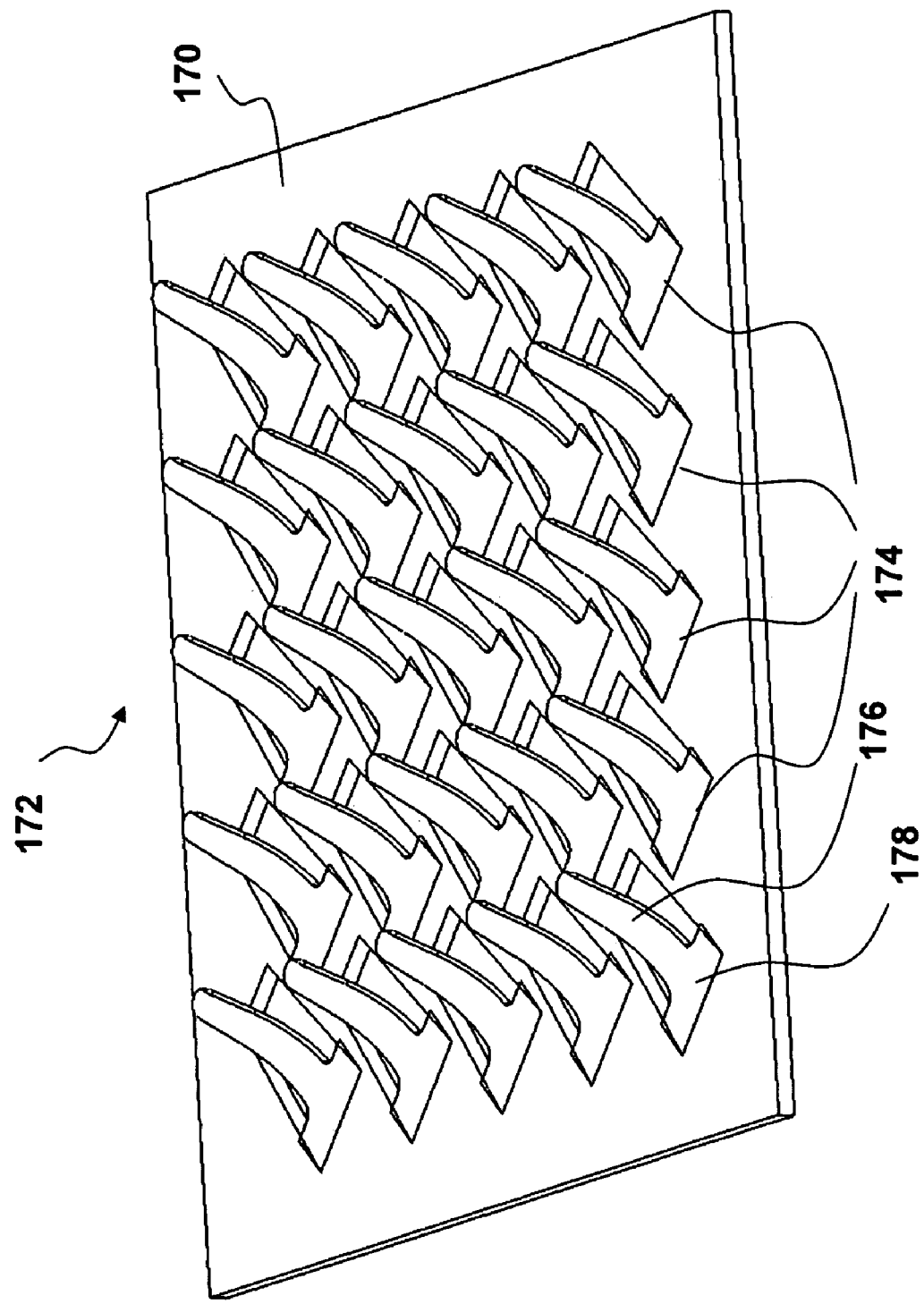
FIG. 5 is a schematic perspective view that illustrates one example of a conductive sheet having an array of elastic contacts formed in three dimensions according to the exemplary steps of FIG. 2.

FIG. 5 illustrates one example of a conductive sheet having an array of elastic contacts formed in three dimensions according to the steps outlined above. Conductive sheet 170 includes contact array 172 containing a plurality of three dimensional contacts 174, each having a base portion 178 and contact arm portions 176. At this stage of processing, the contacts of array 172 are integrally connected to sheet 170 and are therefore not electrically isolated from each other. Base portions 178 are partially etched but sufficient material remains between the bases and the rest of the spring sheet to maintain the semi-isolated contacts and sheet as a unitary structure. In other configurations of the invention, no partial etch to define base portions is performed up to step 130.

Referring again to FIG. 2, in step 132, the conductive sheets can be heat treated to precipitation harden and enhance spring properties of the contacts. As mentioned above, this can impart higher strength, such as higher yield strength, and/or higher elastic modulus to the contact arms by, for example, precipitation hardening of a supersaturated alloy. Heat treatment can be performed in a non-oxidizing atmosphere, such as nitrogen, inert gas, or forming gas, to prevent oxidation of the conductive sheet.

In step 134, spring sheets having three-dimensionally formed contact elements are subjected to cleaning and surface preparation. For example, an alkaline clean can be performed, followed by a sulfuric oxide/hydrogen peroxide etch (micro-etch) to enhance adhesion properties of the spring sheet surface for subsequent lamination processing. The micro-etch can be used to roughen the surface, for example.

After step 134, the cleaned and prepared spring sheet can be joined to a PCB substrate at step 106, as illustrated in FIG. 1.

Figure 6A:
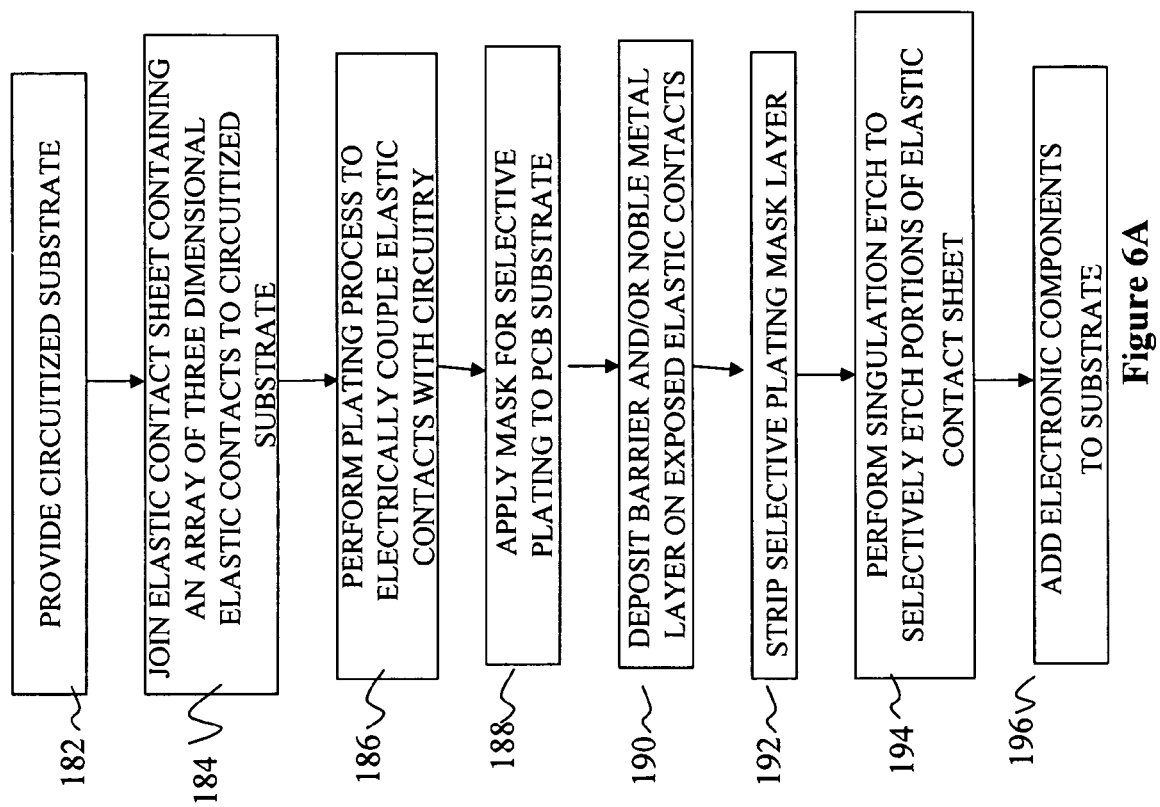
FIG. 6A is a flow chart that illustrates exemplary steps involved in a method for producing a circuitized substrate with an integrated elastic contact array, in accordance with a further aspect of the present invention.

FIG. 6A illustrates exemplary steps involved in a method for producing a circuitized substrate with integrated elastic contact array, in accordance with a further aspect of the present invention. The circuitized substrate may be a PCB, a flexible substrate, a circuitized connector that is used as an interposer, or an electronic package, for example. In the discussion to follow concerning the steps illustrated in FIG. 6A, reference made to use of a PCB substrate includes circuitized substrates as a whole.

Figure 6B:
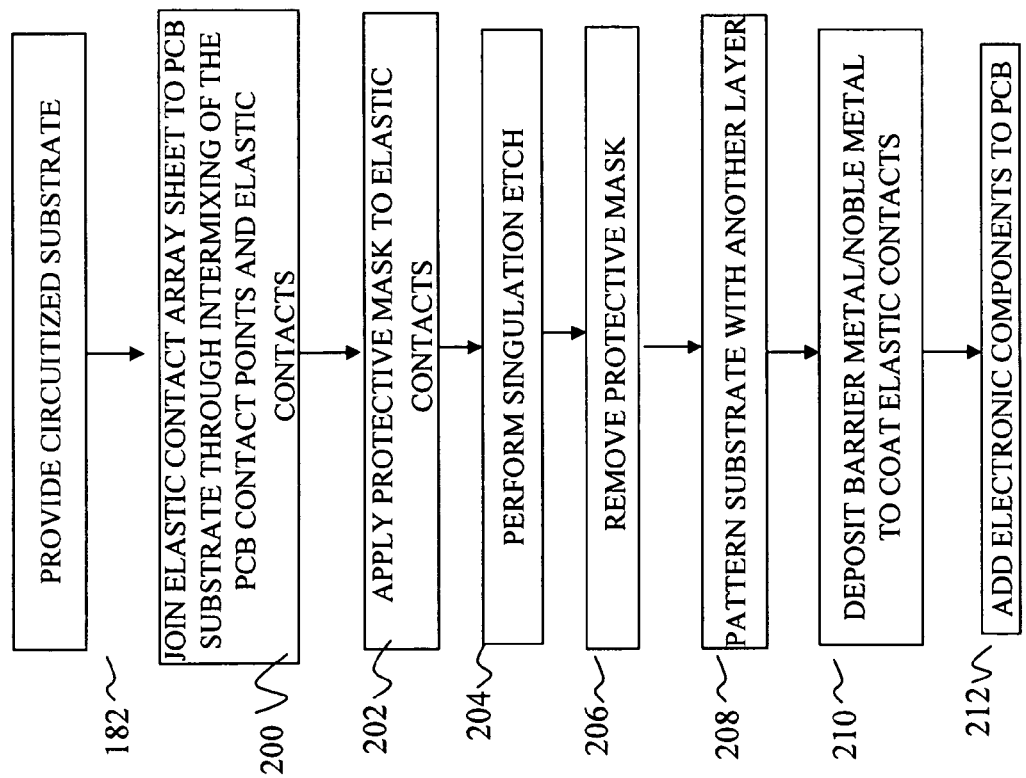
FIG. 6B is a flow chart that illustrates exemplary steps involved in a method for producing a circuitized substrate with an integrated elastic contact array, in accordance with another aspect of the present invention.
Figure 6C:
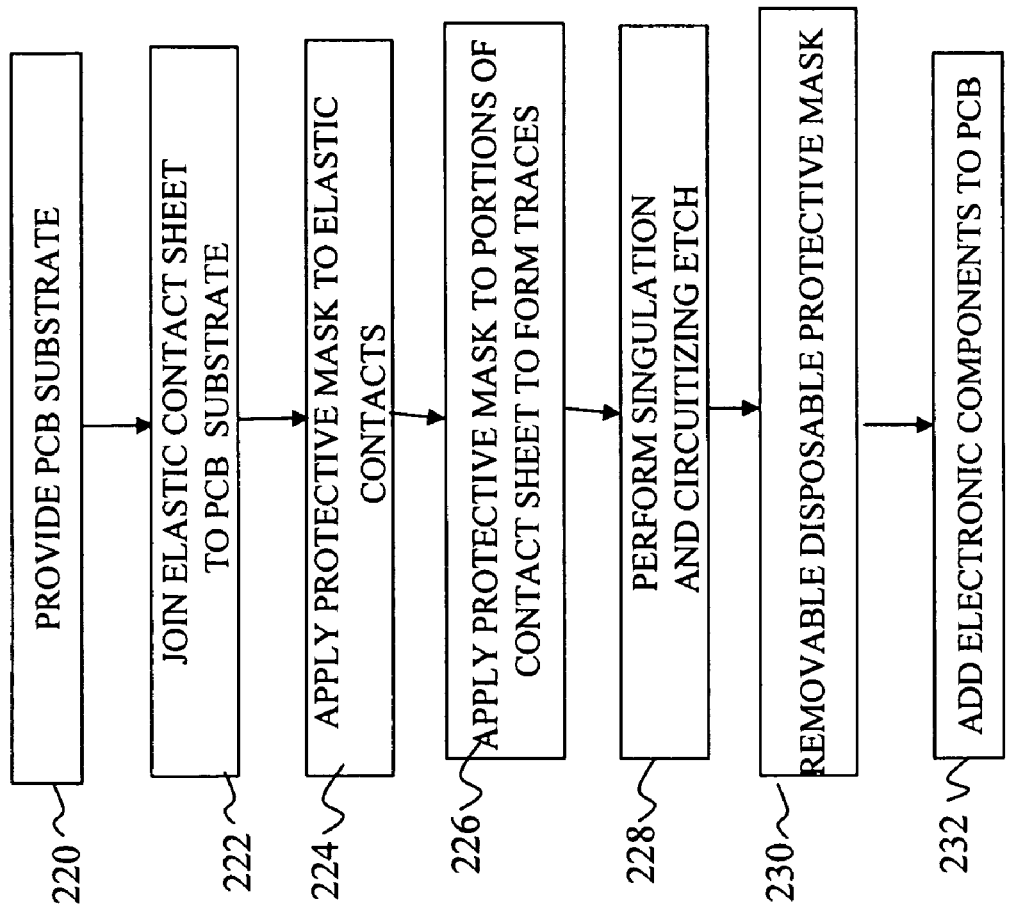
FIG. 6C is a flow chart that illustrates exemplary steps involved in a method for producing a circuitized substrate with an integrated elastic contact array, in accordance with another aspect of the present invention.
Figure 6D:
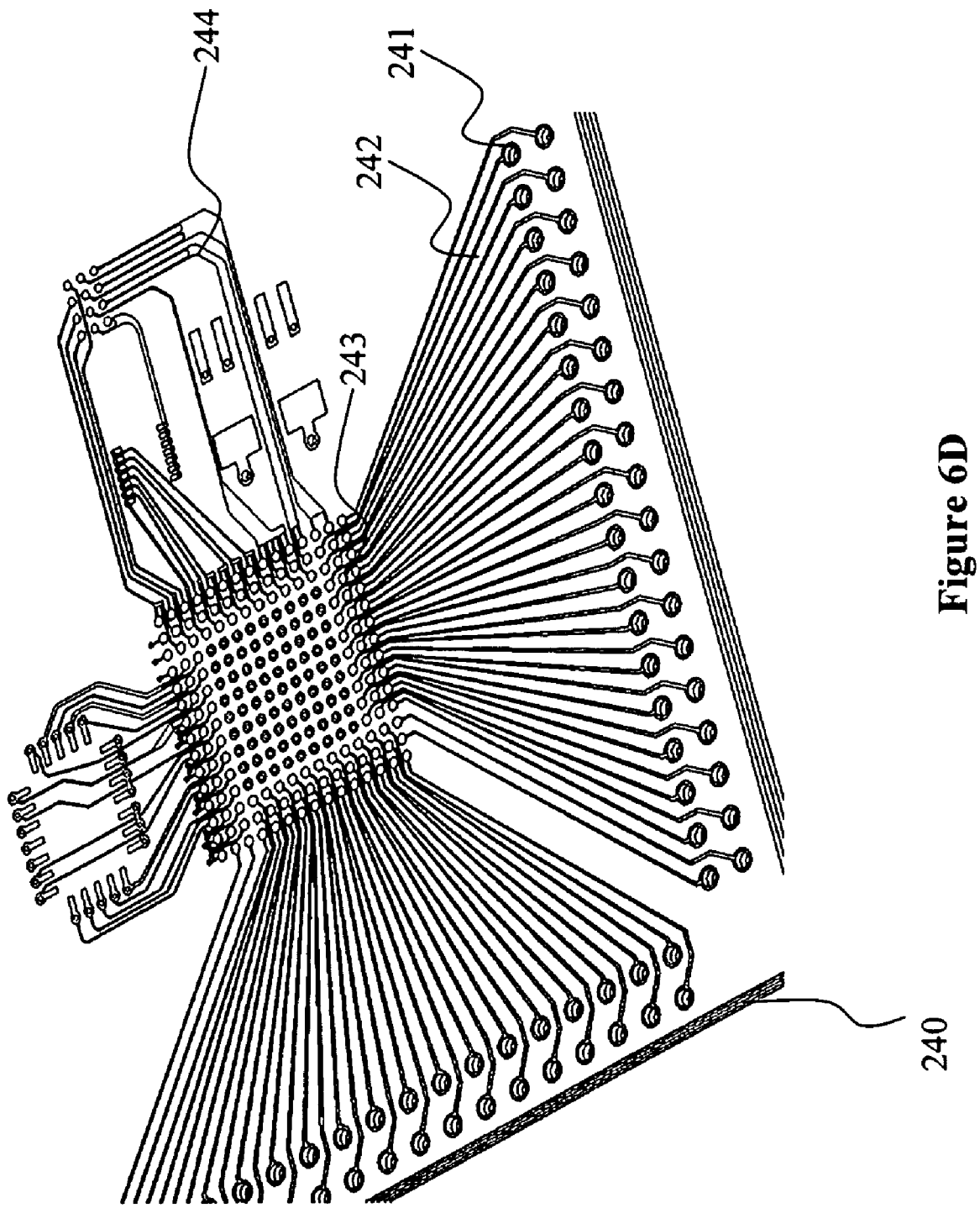
FIG. 6D is a schematic perspective view that illustrates a circuitized substrate.

In step 182, a circuitized substrate is provided, as illustrated in FIG. 6D. Circuitized substrate 240 may include receptacles 241, circuit traces 242, contact points 243, and additional circuitry 244. Contact points 243 are connected to circuit traces 242 and are provided in an array that is configured to electrically couple to a corresponding array of elastic contacts.

In step 184, an elastic contact sheet containing an array of three dimensional elastic contacts is joined to the circuitized substrate. In one variant, the elastic contact sheet and circuitized substrate can be joined using an adhesive interlayer. In another variant, the elastic contact sheet and circuitized substrate can be joined using mechanical and/or metallurgical bonding. The joining process may be facilitated by application of heat and pressure.

Figure 6E:
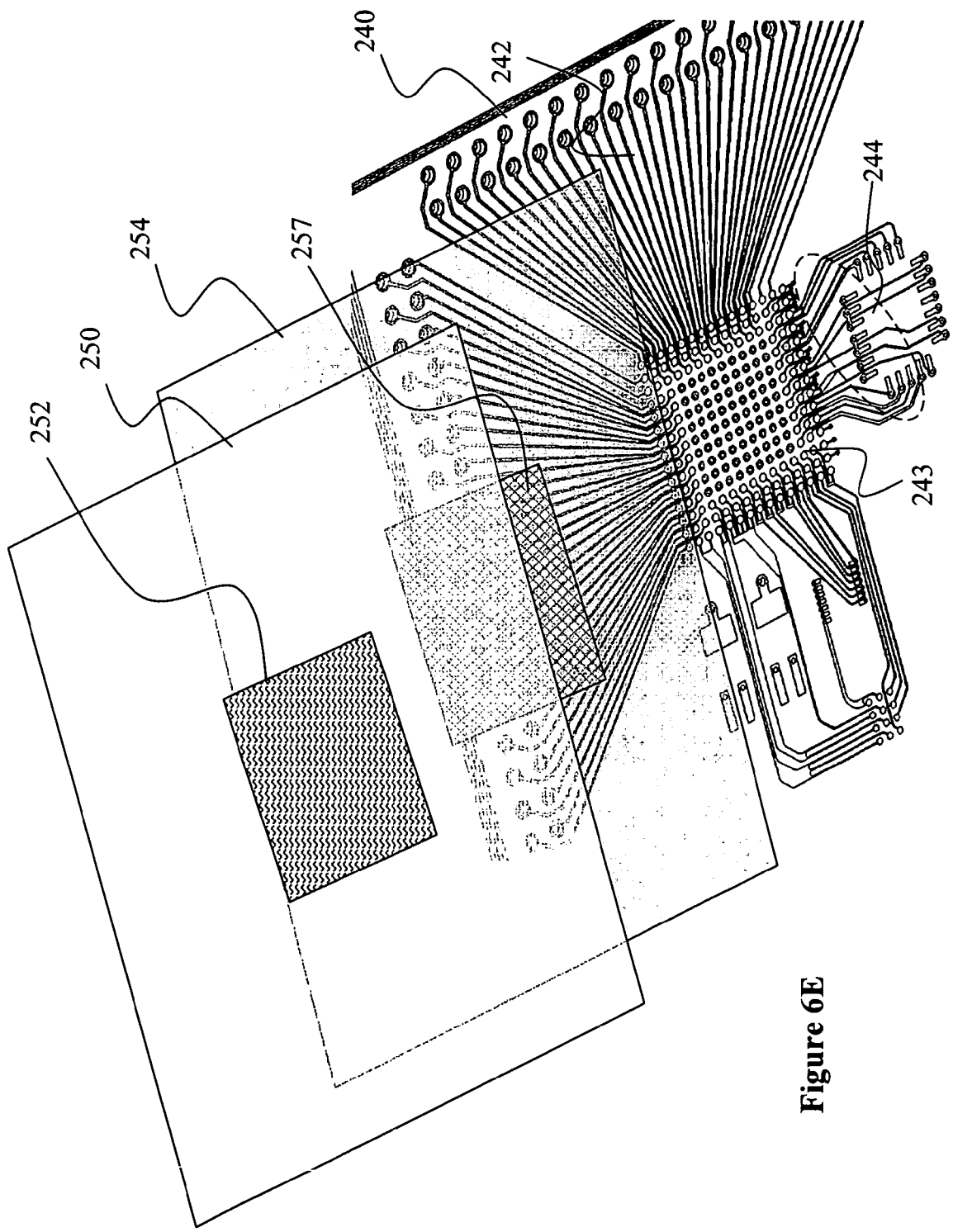
FIG. 6E is a schematic perspective view that illustrates the joining of a circuitized substrate with an elastic contact sheet, according to one aspect of the present invention.

FIG. 6E illustrates the joining of a circuitized substrate (layer) 240 with an elastic contact sheet (layer) 250. After circuitized substrate 240 and spring sheet 250 are brought together, heat and pressure can be applied to form a laminate that includes layer 240 and layer 250, as well as any intervening layers located between layers 240 and 250, such as an adhesive layer 254. Adhesive layer 254 can also act to electrically isolate circuitry 242 and 244 in substrate 240 from conductive spring sheet 250. In the example shown, substrate 240 is provided with array of contact points 243 that can be arranged to lie underneath corresponding elastic contacts in array 252 of sheet 250 when substrate 240 and sheet 250 are laminated together. Adhesive sheet 254 is provided with patterned openings 256 to facilitate electrical coupling of array 252 and contact points 243, as described below.

Figure 6F:
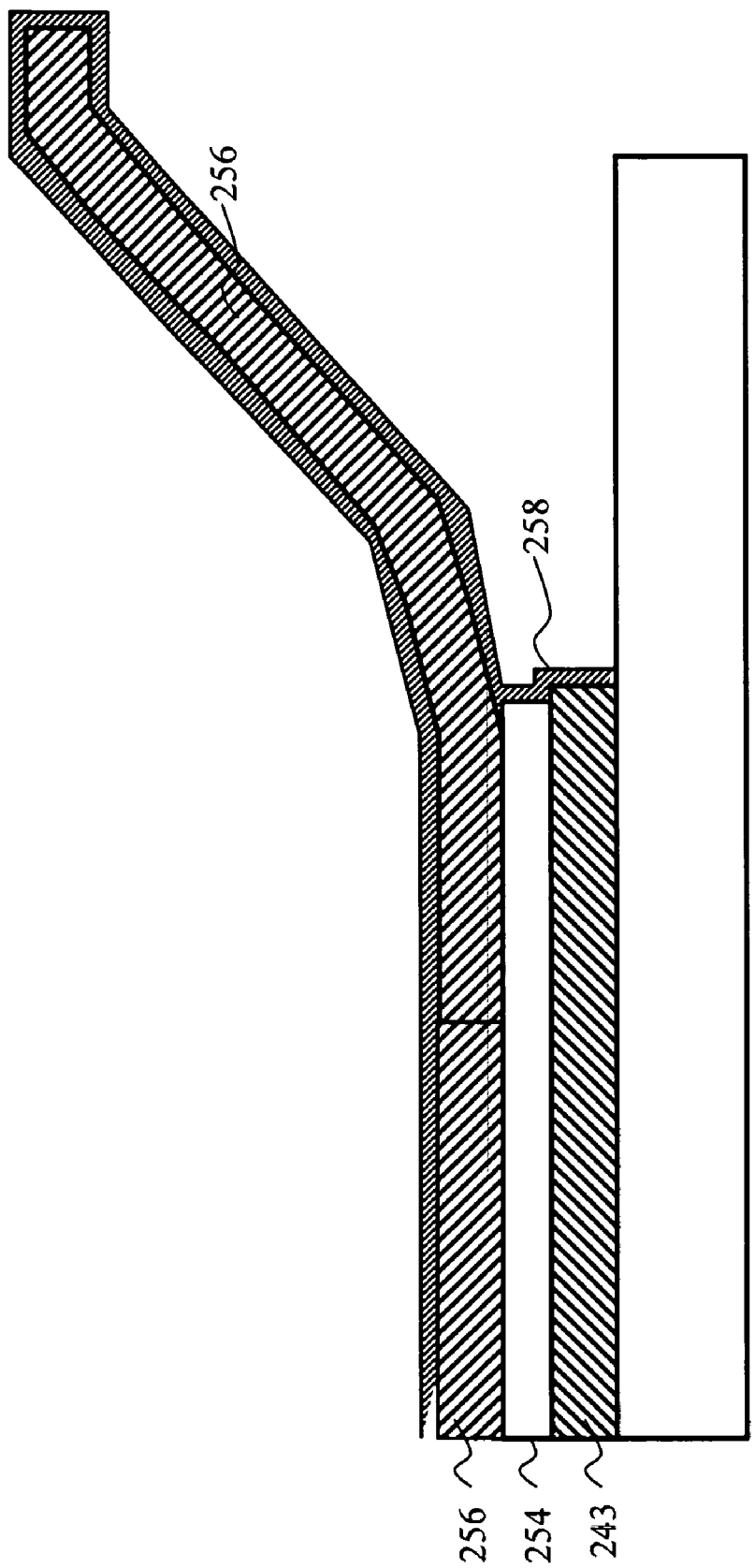
FIG. 6F is a schematic cross-section of an exemplary contact that illustrates the deposition of plating material to electrically join elastic contacts and contact points, in accordance with one aspect of the present invention.

In step 186, a plating process is performed to electrically couple the elastic contacts of the elastic sheet with circuitry provided in the PCB substrate. For example, elastic contacts in contact array 252 may be initially electrically isolated from contact points 243 by an insulating adhesive layer, such as layer 254. The adhesive layer 254 can be provided with openings 257 (see FIG. 6E) arranged in a pattern so that openings each lie above a region adjacent to contact points 243. As illustrated in FIG. 6F, plating material 258 can be deposited on the periphery of the opening in adhesive layer 254 to electrically join elastic contacts 252 and contact points 243 that are disposed on the top and bottom surfaces, respectively, of adhesive layer 254.

In step 188, a mask designed to allow selective plating is applied to the PCB substrate containing the array of elastic contacts. The mask provides openings over the individual elastic contacts such that the elastic contacts can be plated in a subsequent step. Regions between elastic contacts, as well as regions outside the elastic contact array may be covered with the mask. Typically, the mask comprises a resist material that can be subsequently removed.

In step 190, a barrier and/or noble metal layer is deposited by a process such as plating on the exposed elastic contacts.

In step 192, the selective plating mask layer is stripped away leaving areas of the elastic contact sheet without any barrier/noble metal, as well as the elastic contacts that contain the barrier/noble metal.

In step 194, a singulation etch is performed that selectively etches the metal of the elastic contact sheet. For example, if the elastic contact sheet is a Cu—Be alloy, the etch is designed to remove Cu—Be while leaving in place the barrier/noble metal. Thus, regions between the elastic contacts that have no barrier metal coating are etched away. This process results in the elastic contacts becoming singulated from each other.

In step 196, electronic components may be added to the substrate to complete the PCB assembly process. The PCB can subsequently be coupled reversibly to external components using the elastic contact array.

FIG. 6B illustrates exemplary steps involved in a method for producing a circuitized substrate with an integrated elastic contact array, in accordance with another aspect of the present invention.

In step 182, a circuitized substrate is provided. Then, in step 200, the elastic contact array sheet is joined to the PCB substrate through intermixing of the PCB contact points with corresponding elastic contacts. For example, the elastic contact array in the elastic contact sheet can be registered with the array of contact points, with the help of registration pins and holes provided in the respective layers. Base portions of the elastic contacts can be placed in contact with respective contact points in the PCB, such as contact pads. Thus, the base portions of contacts in an array of elastic contacts can each be placed into contact with a corresponding contact pad in the PCB substrate. Application of heat and/or pressure can then result in reaction at the interface of the base portions and contact pads to form a metallic bond that spans the interface and forms a continuous metallic structure between the contact pads and elastic contacts.

In one example, a solder compound is applied to the surface of the contact pads and/or to the surface of the spring sheet before heat is applied in order to facilitate the joining of the spring sheet and contact pads. This typically results in an intermetallic layer forming between the solder material and one or both of the contact pads and elastic contacts, after application of heat.

Figure 6G:
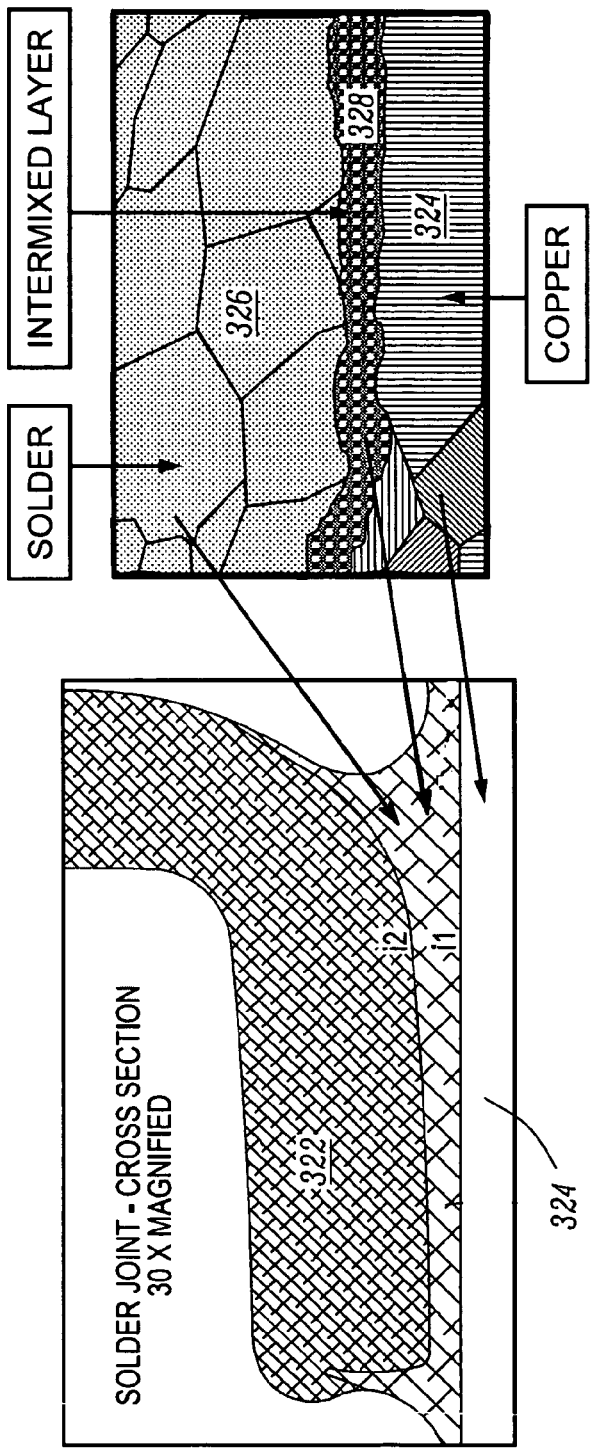
Figure 6G:
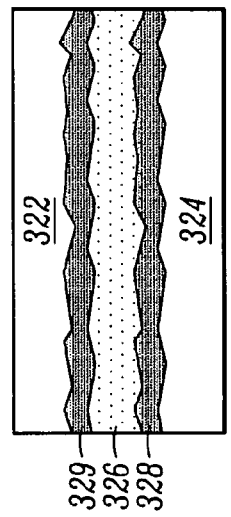

FIGS. 6G and 6G1 illustrate cross-sectional details of a contact structure 320 arranged in accordance with a configuration of the present invention. Elastic contact 322 is joined to contact pad 324 using solder 326. An intermixed layer 328 lies at interface i1 between solder 326 and contact pad 324. In addition, a second intermixed layer 329 can typically form at the interface i2 between the solder and the elastic contact. The intermmixed layer that comprises layer 328 results from interdiffusion of material from contact pad 324 and solder 326. The intermixed layer can comprise, for example, an intermetallic compound, an alloy, a mixture of phases, or other mixed region that forms when heat is applied in the vicinity of the solder. Such intermixed layers serve to increase the adhesion between the elastic contacts and underlying contact pads, as well as providing good electrical connection between the elastic contacts and circuitry located in the substrate and connected to the contact pads.

Because the intermixed layers result from interdiffusion of, for example, a copper-containing contact and a solder, material from both the copper-containing contact and material from the solder are typically incorporated in an intermixed layer. The compounds and/or alloys that are formed by interdiffusion of material from both contact and solder are bonded at the atomic level both within the intermixed layer and at both interfaces of the intermixed layer. Therefore, the contact structure comprising elements 324, 326, and 328 comprises a stable, unitary, atomically bonded contact structure including intermetallic bonds. Examples of intermixed materials that form in such a process include $Cu_3Sn$ and $Cu_6Sn_5$.

Intermixed layers can alternatively be formed by brazing of elastic contacts to respective contact points with a high temperature solder, or by welding elastic contacts to respective contact points. In the latter process, an intermediate material need not be used. Accordingly, the intermixed zone formed by welding of an elastic spring sheet and contact point might only contain one intermixed layer located in the region of the original interface of the elastic contact and the contact point. In the above examples, the intermixed layers 328 and 329 can range in thickness from many micrometers down to a few nanometers, depending on the exact method, the materials, and the process conditions used to join the elastic contact to a respective contact point.

Referring to FIG. 6B, in step 202, a protective mask is applied to the elastic contacts. The mask can be a photoresist layer, for example, an electrodeposited resist that is patterned in such a manner that spring sheet areas between elastic contacts are left unprotected, while the elastic contacts remain conformally coated with photoresist after resist patterning.

In step 204, a singulation etch is applied. In this case, the etch is designed to remove the spring sheet material, while not attacking the protective mask. Unprotected regions of the spring sheet between elastic contacts are removed, resulting in elastic contacts that are isolated (singulated) from each other.

In step 206, the protective mask is removed, for example, by a photoresist strip process in the case of a photoresist mask.

In step 208, the substrate is patterned with another layer (typically resist), such that elastic contacts are exposed.

In step 210, a barrier metal/noble metal deposition is performed to coat the elastic contacts and provide a good contact interface.

After stripping of the resist, in step 212 electronic components are added to the PCB.

FIG. 6C illustrates exemplary steps involved in a method for producing a circuitized substrate with integrated elastic contact array, in accordance with another aspect of the present invention.

Figure 6H:
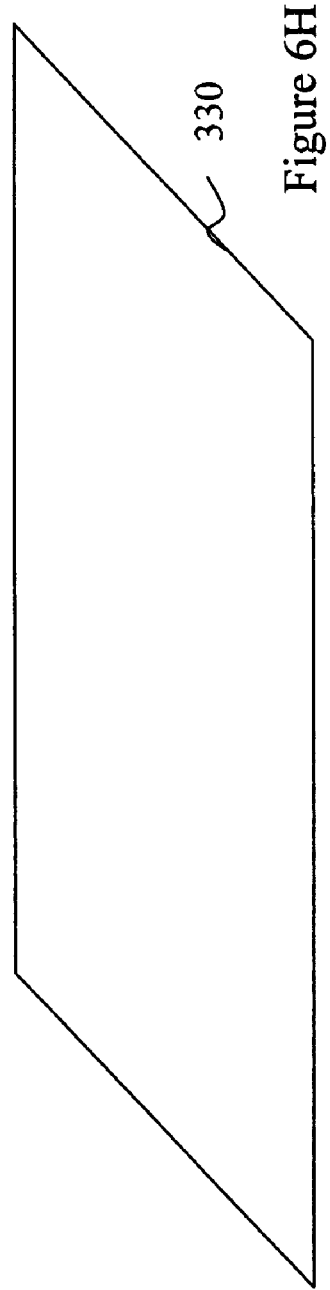
FIG. 6H is a schematic perspective view that illustrates an insulating substrate that is provided without circuitry.

In step 220, a PCB substrate is provided. As illustrated in FIG. 6H, the PCB substrate 320 can be an insulating substrate that is provided without circuitry.

Figure 6I:
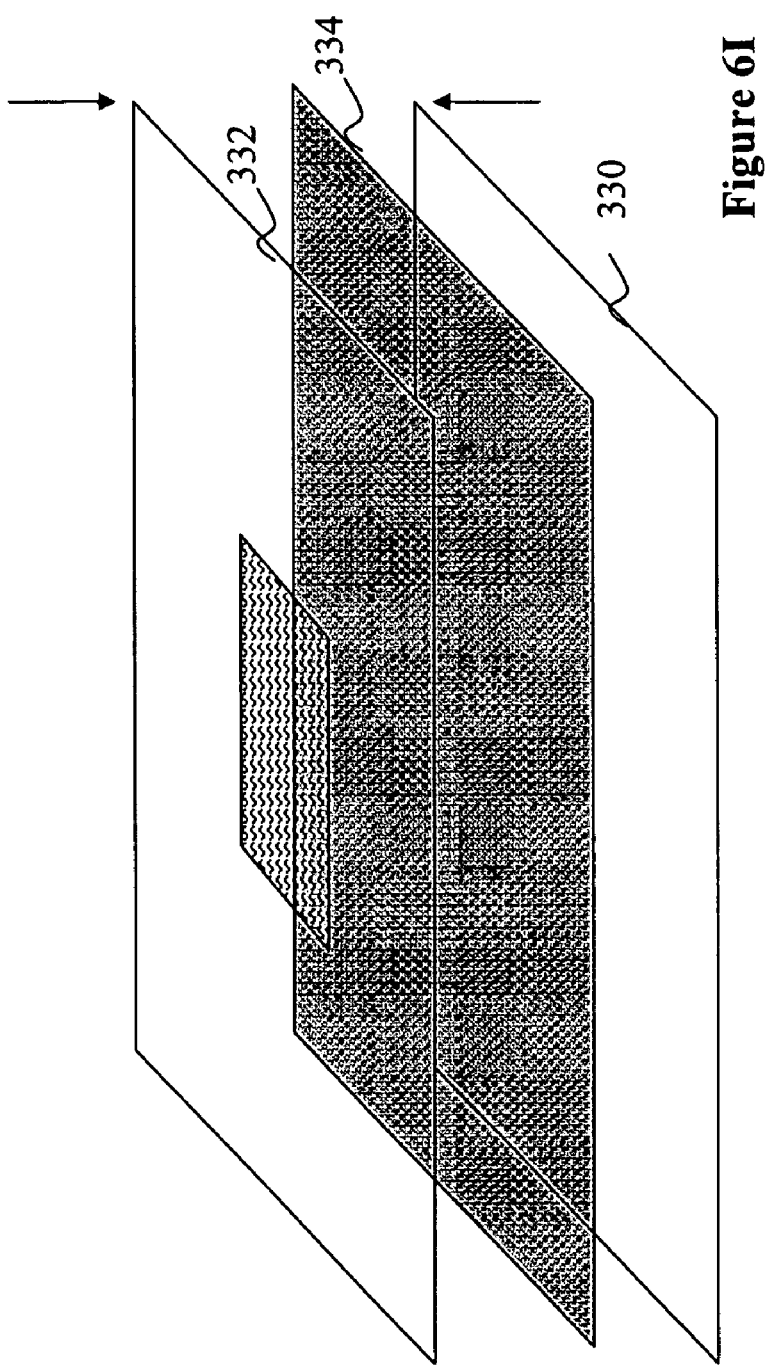
FIG. 6I is a schematic perspective view that illustrates the joining of an elastic contact sheet and a PCB substrate in accordance with one aspect of the present invention.

In step 222, the PCB substrate is joined to an elastic contact sheet, such as a contact sheet formed according to the method disclosed above with respect to FIG. 2. In order to facilitate joining, an adhesive layer can be provided that is disposed between the PCB substrate and spring sheet. After bringing together the PCB substrate and spring sheet, the adhesive material can remain as an interlayer between at least portions of the PCB substrate and spring sheet. FIG. 6I illustrates the joining of an elastic contact sheet 332 and a PCB substrate 330 with the aid of adhesive layer 334.

In step 224, a protective mask is applied to the elastic contacts of the spring sheet material. In one variant, the mask is a noble metal/barrier metal mask applied by selectively plating the elastic contacts, as described above with respect to FIG. 6A. In another variant, the mask is a photoresist mask such as an electrodeposited resist that is patterned to leave resist on the elastic contacts.

Figure 6J:
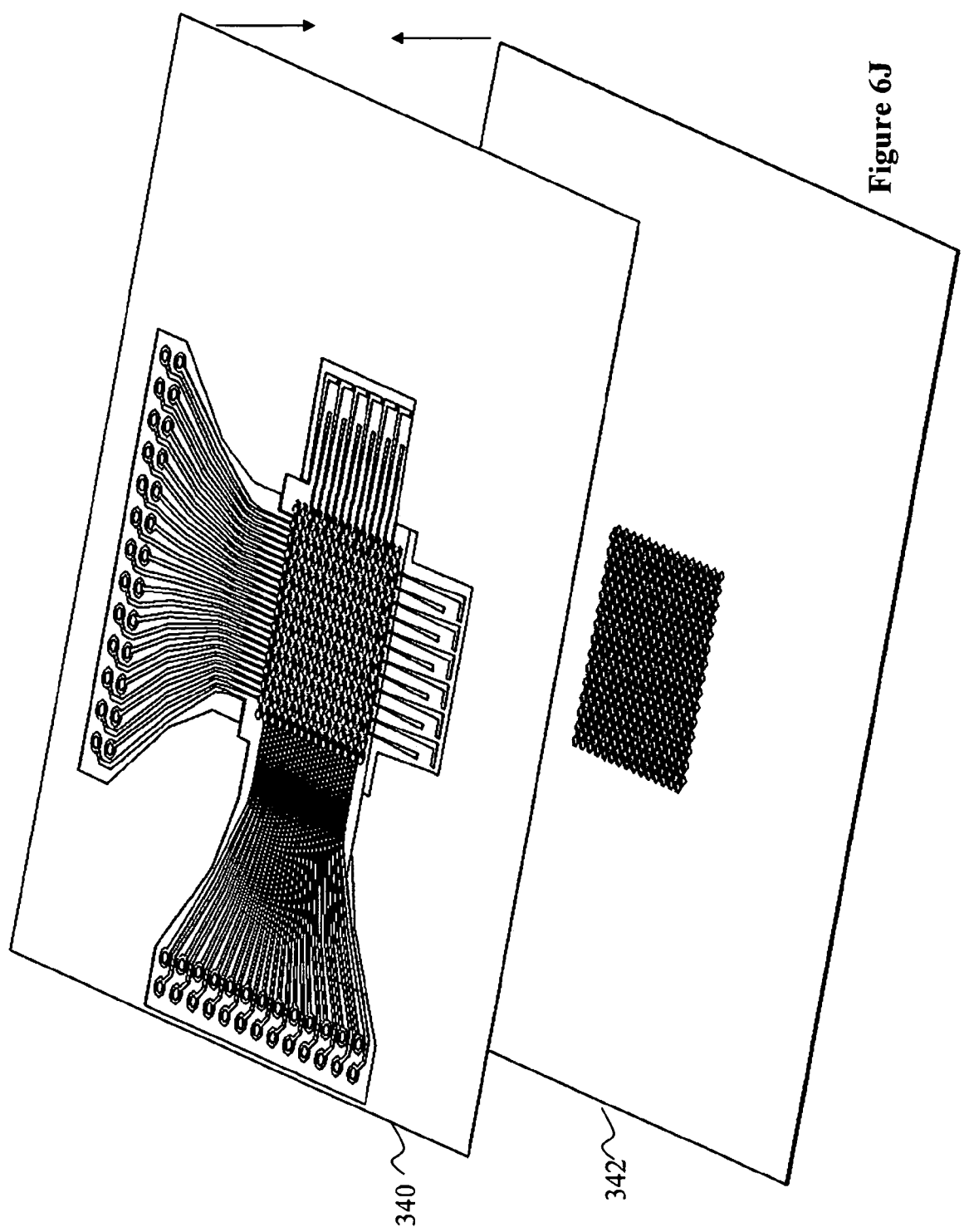
FIG. 6J is a schematic perspective view that illustrates the application of a masking layer to a spring sheet material in accordance with one configuration of the present invention.

In step 226, a protective mask is applied to portions of the spring sheet material such that a pattern in the form of circuit traces is formed. For example, a photoresist mask can be patterned to produce photoresist lines that coat portions of the spring sheet that extend from individual elastic contacts to other regions of the spring sheet. FIG. 6J illustrates the application of a masking layer 340 to a spring sheet material 342 in accordance with one configuration of the present invention. The spring sheet material is previously joined to a PCB substrate (not shown). The masking layer may be provided as a blanket photoresist layer that is applied to the spring sheet and patterned using a mask pattern in a reusable mask that creates the pattern shown in the photoresist after exposure of the photoresist to a radiation source through the reusable mask. After the resist is exposed and developed, the spring sheet remains protected by photoresist according to the mask pattern.

In one configuration of the present invention, the protected portions of the mask define a pattern of circuitry to be imparted into the spring sheet.

In step 228, a singulation and circuitizing etch is performed. Unprotected areas of the spring sheet are removed during the etch, leaving singulated contacts having metal traces formed from the spring sheet that extend from a portion of a respective contact. Thus, elastic contacts are formed that are integrally connected to circuit traces formed within the same spring sheet layer as the contacts.

In step 230, any disposable portions of the protective mask that remain over the contacts and traces, such as resist, are removed. Accordingly, a circuitized PCB substrate is formed in which at least a portion of the circuitry leading to the elastic contacts, as well as the elastic contacts themselves are formed from a single sheet of conductive material, as illustrated in FIG. 6K.

Figure 6K:
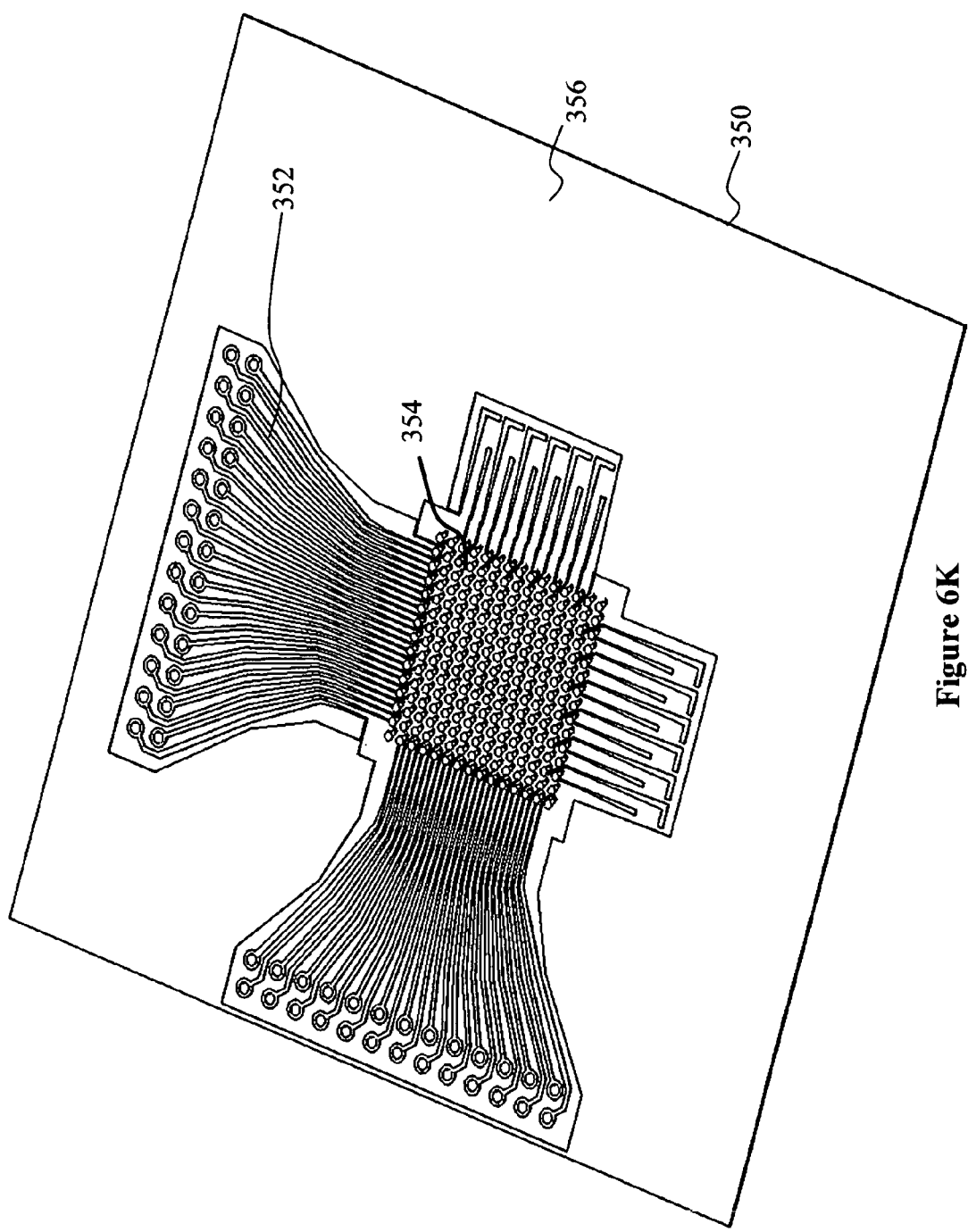
FIG. 6K is a schematic perspective view that illustrates a circuitized PCB having an integrated elastic contact array according to one configuration of the invention.

Circuitized PCB 350 illustrated in FIG. 6K includes circuitry 352 and elastic contact array 354 that are formed integrally within spring sheet 356.

In step 232, electronic components are added to the circuitized PCB substrate. The electronic components can be added in standard receptacles provided in the PCB.

Figure 7:
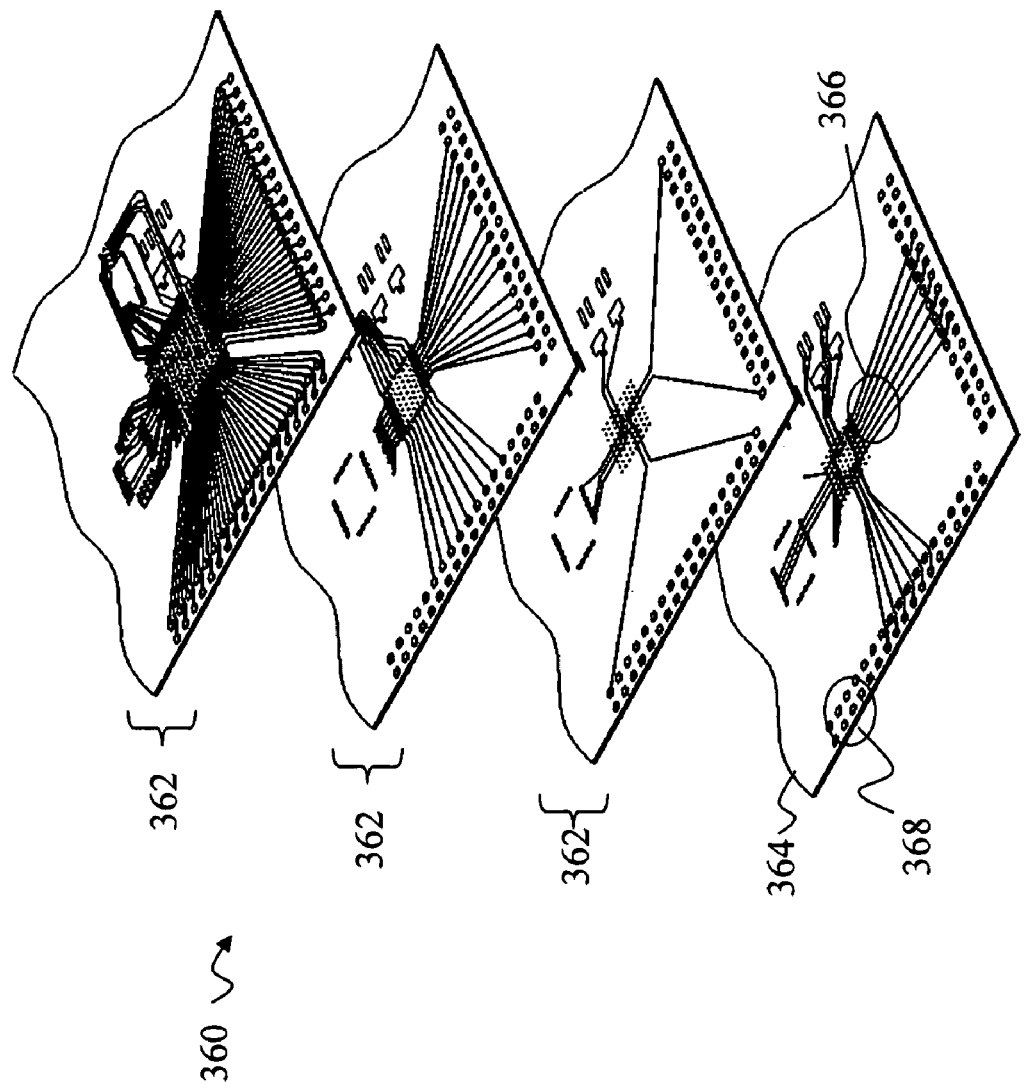
FIG. 7 is a schematic stack up that illustrates a PCB substrate that includes a plurality of PCB layers, each of which is provided with a substrate layer and circuitry, according to one configuration of the present invention.

In one configuration of the present invention, a PCB having an integrated elastic contact array includes multiple PCB layers that each comprise insulating substrates and circuitry. In this context, the term "PCB layer" can include an insulating substrate core such as FR4 or similar material, an adhesive layer or layers as needed, and circuitry that can be applied to the substrate, as well as vias, plated through holes, and alignment holes. FIG. 7 illustrates a blowup of a PCB substrate stack 360 that includes a plurality of PCB layers 362, each of which is provided with a core layer 364 and circuitry 366. Vias 368 are included to provide electrical connectivity between circuitry disposed in different layers. PCB substrate 360 can be used to form a PCB that includes an integrated elastic contact array according to any of the methods outlined in FIGS. 1, 2, 6A, and 6B. The additional layers of circuitry can be used to provide adequate input/output circuitry for carrying electrical signals to elastic contacts arranged on the surface of the PCB device. For example, a 16×16 array of contacts can require 256 input/output paths which can be more conveniently provided in a series of layers that connect to the contact bases, rather than within one layer.

Figure 8:
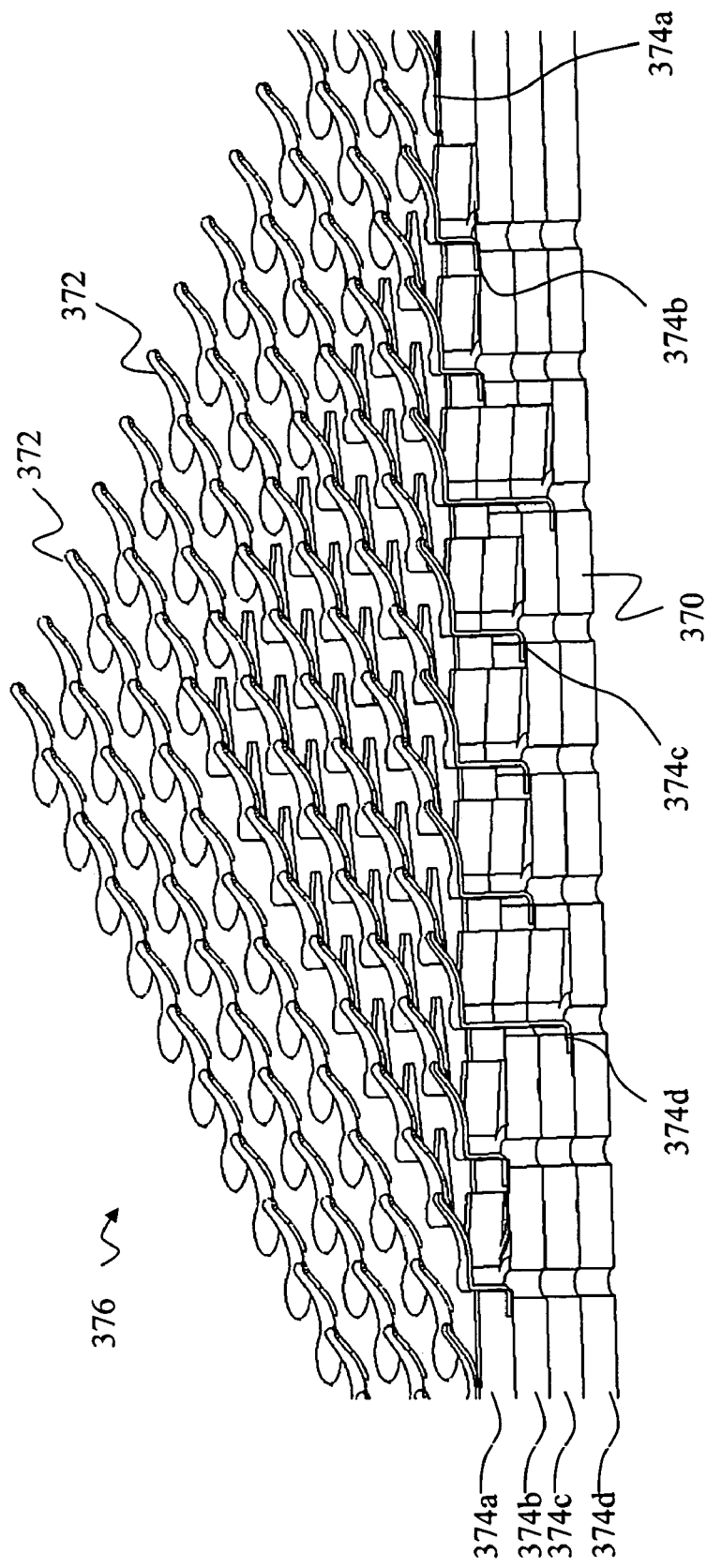
FIG. 8 is a schematic perspective view that illustrates, in accordance with another configuration of the present invention, a cross-sectional perspective view of a four layer PCB having different sets of contacts in which contacts extend from each of the four layers.

In another configuration of the invention, one or more layers of an elastic spring sheet are intercalated between PCB layers. In other words, an elastic spring sheet is joined to a first PCB layer including associated electrical circuitry, followed by application of a second PCB layer. This process can be repeated such that several sets of elastic contact arrays are incorporated between successive PCB insulator layers. After removal of unwanted spring sheet material, remaining three dimensional elastic contacts in an array bonded to a first PCB insulator layer can be accommodated by a successive layer by providing holes in the successive layer through which the elastic contacts can extend. In this manner, a final multilayer PCB device can be fabricated that includes elastic contacts whose base portions are located at different layer positions within the multilayer stack, and whose elastic portions all extend above the surface of the multilayer PCB device. FIG. 8 illustrates, in accordance with another configuration of the present invention, a cross-sectional perspective view of a four layer PCB 370 having different sets of contacts 372a-d in which contacts extend from each of the four respective layers 374a-d and whose elastic portions all extend above the surface of PCB 370. In the device illustrated, the four sets of contacts form a master contact array 376 that has approximately square dimensions.

In other configurations of the invention described below, the circuitized substrate can be a printed circuit board or a circuitized connector. It will be understood that a printed circuit board can contain similar materials and elements as other types of circuitized connectors, such as an interposer. Each may include similar substrate material and each may include circuitry. However, an interposer would generally function to primarily interconnect separate external components disposed on opposite sides of the plane of the interposer, while a printed circuit board need not do so. In addition, the printed circuit board can typically host a large number of electronic components on one or more surfaces of the printed circuit board.

According to one configuration of the present invention, a printed circuit board includes a dielectric layer and an area array of contact elements formed on a first surface of the dielectric layer. Each contact element includes a conductive portion disposed to engage a respective pad of a land grid array module for providing electrical connection to the land grid array module. The land grid array module can include a land grid array package or a second printed circuit board.

In another configuration, a contact element in the area array includes a base portion of conductive material and an elastic portion of conductive material formed integrally with the base portion whereby the elastic portion extends from the base portion and protrudes above the first surface of the dielectric layer. In particular, each elastic portion has an elastic working range on the order of the electrical path length of the contact element.

In the present description, an electrical interconnect or a connector refers to a device for connecting two electronic components together, such as an IC chip to a PC board, or for connecting an electronic component to an equipment, such as a tester. In the present description, the term "electrical interconnect" or "electrical connector" will be used interchangeably to refer to the connector of the present invention for connecting to an electronic component using LGA pads for leads. An electrical interconnect system or an electrical connector, as described herein, can be used for electrically connecting two or more electronic components together or for electrically connecting an electronic component to a piece of equipment. The electronic components can include integrated circuit (IC) or chips, printed circuit boards or multi-chip modules. In the case of an LGA formed on a PC board, the LGA is sometimes referred to as an area array. The equipment can include test equipment such as an electrical tester. Furthermore, in the present description, the term "lead" will be used collectively to refer to the electrical connections on the electronic components for making electrical contact with circuitry on or within the electronic components. Thus, the leads of an electronic component can include, but are not limited to, the pads of a land-grid array package or the pads on a printed circuit board.

According to yet another aspect of the present invention, an LGA connector is circuitized to incorporate an electrical circuit connecting to one or more contact elements of the connector. In some configurations, the electrical circuit includes surface mounted or embedded electrical components. By incorporating an electrical circuit coupled to one or more of the contact elements, the LGA connector of the present invention can be provided with improved functionality. A circuitized connector of the present invention can be formed using any conventional LGA interconnect technology. For example, the connector can include contact elements in the form of metal springs, bundled wires, metal in polymer, solid metal tabs, or any other electrical contact technology. Typically, a contact element includes a conductive portion for engaging the pad of the land grid array. Furthermore, the LGA connector can be formed using the contact element of the present invention and described above. Individual contact elements can be formed on the top surface of the dielectric substrate, such as by placing the contact elements directly on the top surface, or by embedding a portion of the contact element within the top surface, or by forming a portion of the contact element within an aperture on the top surface of the dielectric substrate.

Figure 9A:
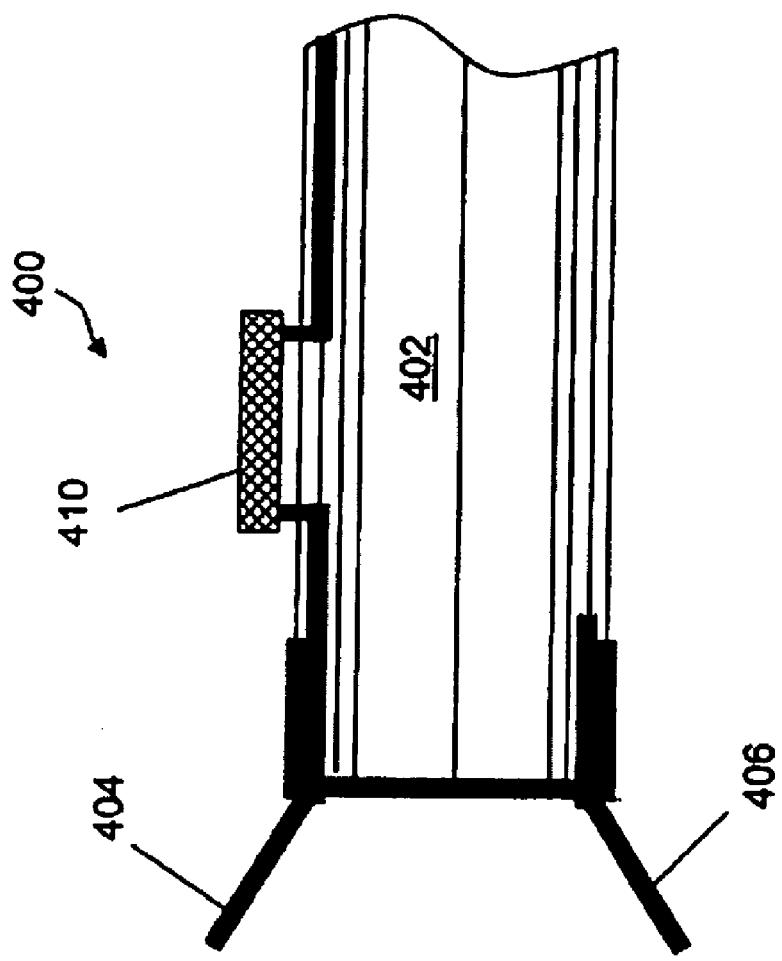
FIG. 9A illustrates one configuration of a circuitized connector in accordance with the present invention.
Figure 9A:
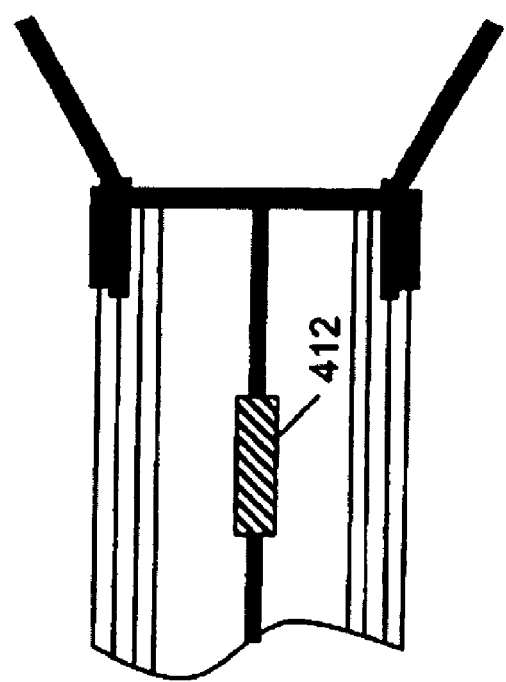

FIG. 9A illustrates one configuration of a circuitized connector in accordance with the present invention. Referring to FIG. 9A, connector 400 includes a contact element 404 on the top surface of dielectric substrate 402 connected to a contact element 406 on the bottom surface of dielectric substrate 402. In the present configuration, contact element 404 is connected to a surface mounted electrical component 410 and an embedded electrical component 412. Electrical components 410 and 412 may be decoupling capacitors which are positioned on connector 400 so that the capacitors can be placed as close to the electronic component as possible. In conventional integrated circuit assembly, such decoupling capacitors are usually placed on the printed circuit board, distant from the electronic component. Thus, a large distance exists between the electronic component to be compensated and the actual decoupling capacitor, thereby diminishing the effect of the decoupling capacitor. By using circuitized connector 400, the decoupling capacitors can be placed as close to the electronic component as possible to enhance the effectiveness of the decoupling capacitors. Other electrical components that may be used to circuitize the connector of the present invention include a resistor, an inductor and other passive or active electrical components. Also, coupling capacitors may be used to make electrical circuits in conjunction with contact elements 402 and 404.

Figure 9B:
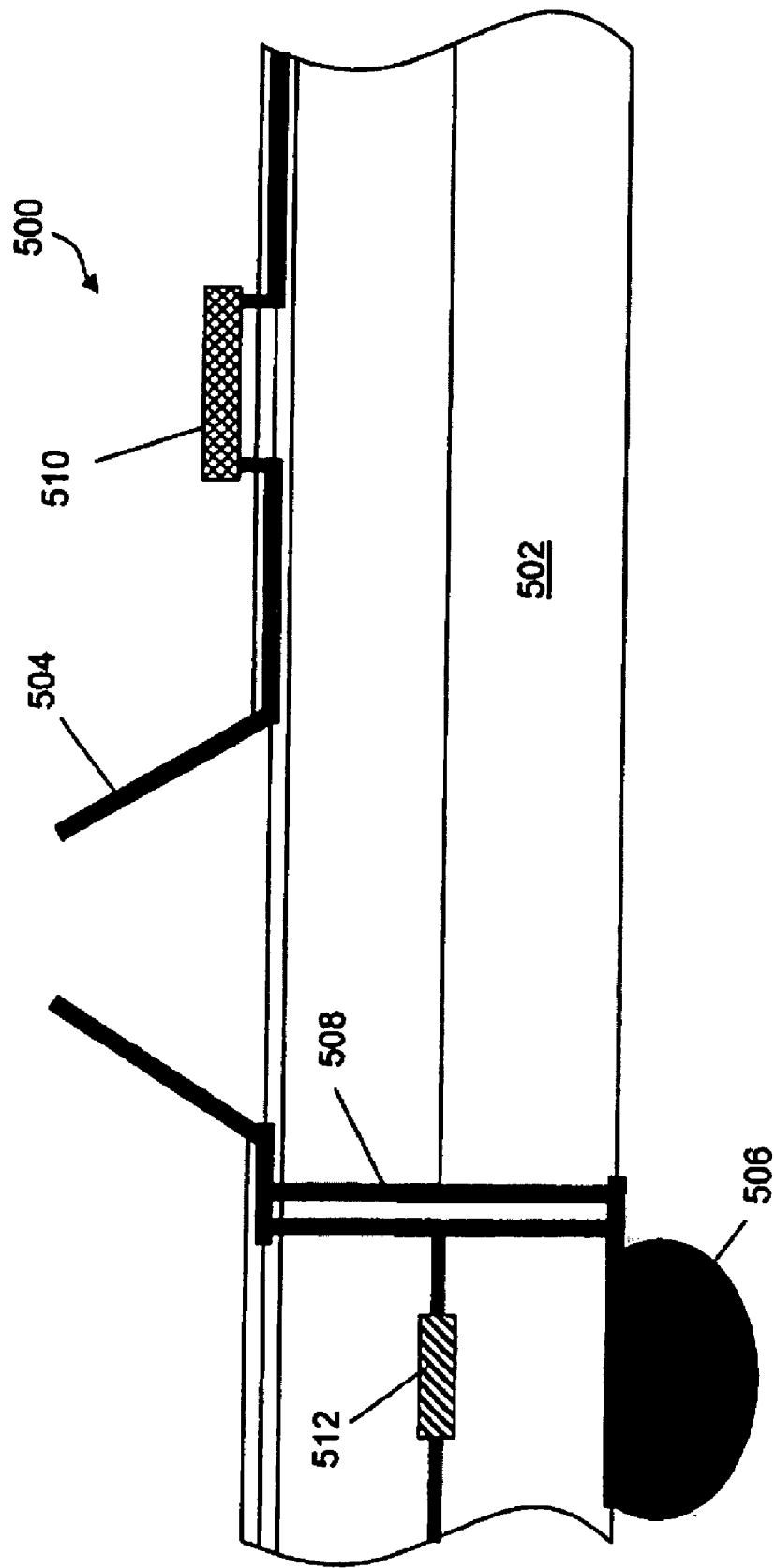
FIG. 9B illustrates another configuration of a circuitized connector according to the present invention.

FIG. 9B illustrates another configuration of a circuitized connector according to the present invention. Connector 500 include a contact element 504 on a dielectric substrate 502 coupled to a solder ball terminal 506 through a via 508. Contact element 504 is connected to a surface mounted electrical component 510 and to an embedded electrical component 512. Connector 500 further illustrates that the placement of terminal 506 does not have to be aligned with contact element 504 as long as the contact element is electrically coupled to the terminal, such as through via 508.

Figure 10A:
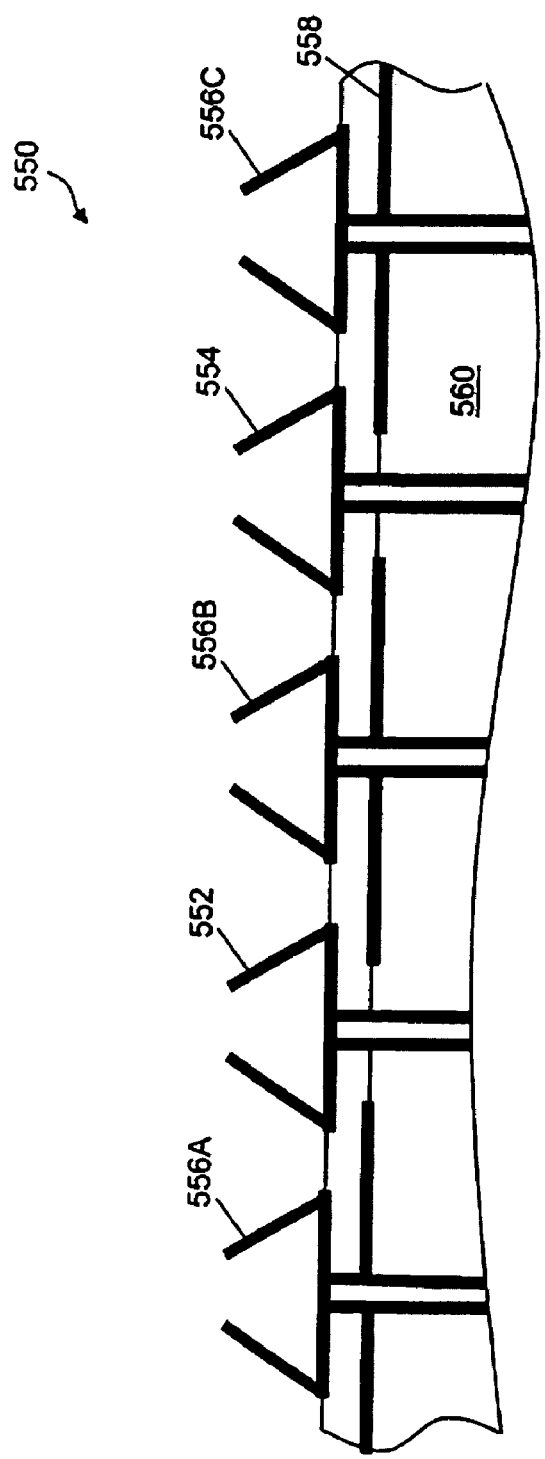
FIG. 10A illustrates another configuration of a circuitized connector in accordance with the present invention.
Figure 10B:
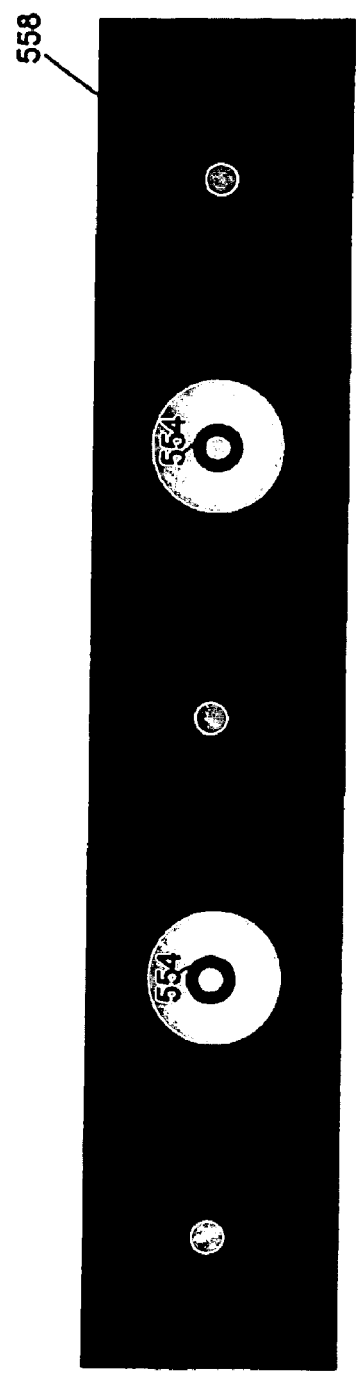
FIG. 10B is a top view of the electrical circuit formed in the dielectric substrate of the connector of FIG. 10A.

Electrical circuits for providing other functionalities can also be applied in the connector of the present invention. In other configurations, a connector of the present invention is circuitized by linking or connecting the power supply pins of the electronic components together, as illustrated in FIGS. 10A and 10B. Referring to FIG. 10A, a connector 550 includes a contact element 552 and a contact element 554 for carrying signals and contact elements 556A to 556C for coupling to a power supply potential, such as a Vcc or a ground potential. In the present configuration, connector 550 is circuitized by including a conductive plane 558 electrically connecting contact elements 556A to 556C together. In the present configuration, conductive plane 558 is forming embedded in substrate 560 and is patterned so that the plane is electrically isolated from contact elements 552 and 554 (FIG. 10B). As demonstrated in FIG. 8, if the conductive plane 558 is a ground plane, the gaps between the conductive plane 558 and the contact elements 552 and 554, as well as the circuitry connecting to the contact elements, can be used to control the contact impedances of contact elements 552 and 554.

Figure 10C:
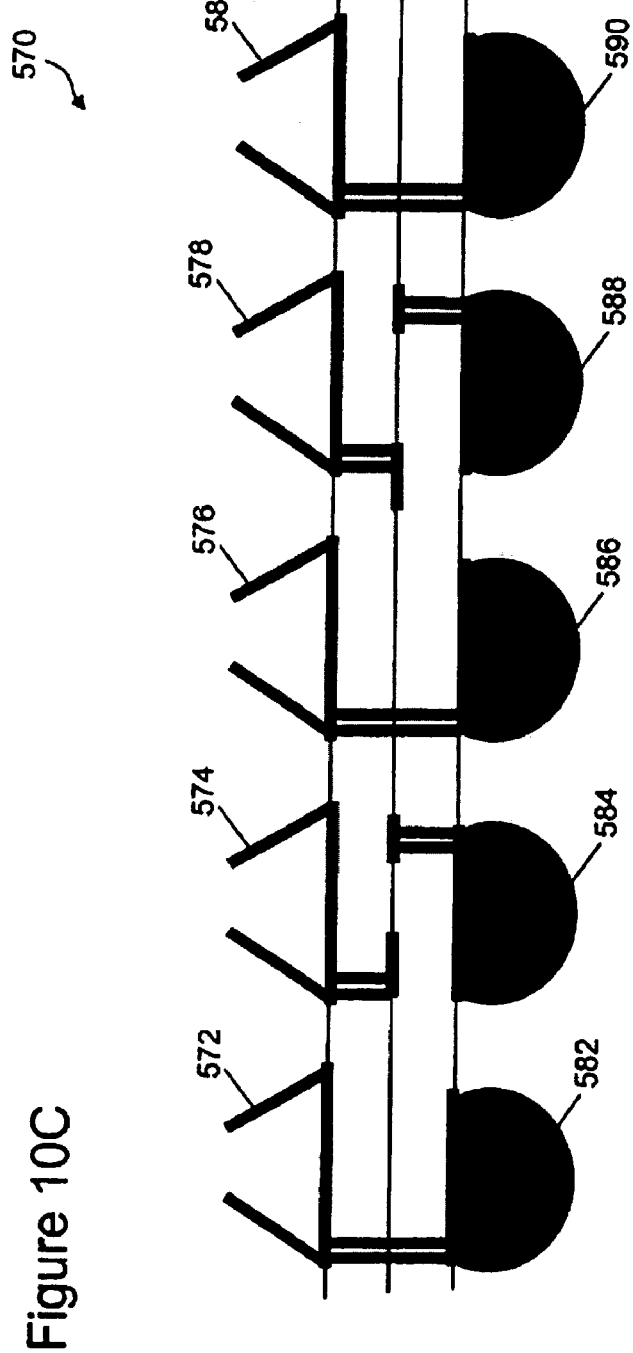
FIG. 10C illustrates another configuration of a circuitized connector in accordance with the present invention.
Figure 10D:
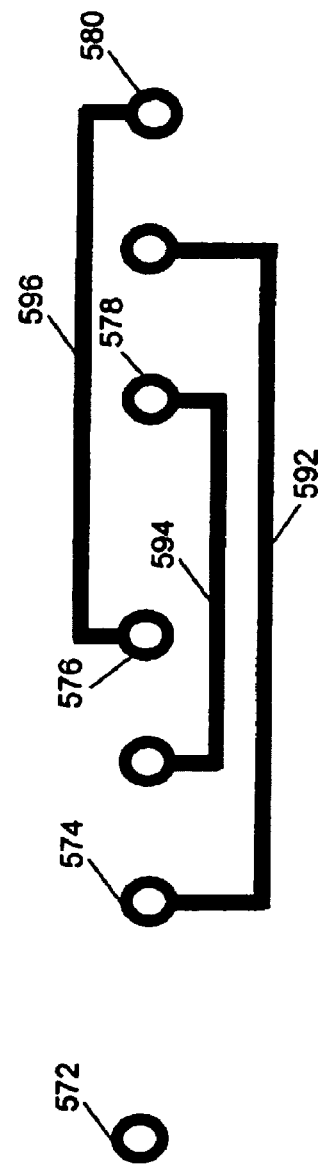
FIG. 10D is a top view of the electrical circuit formed in the dielectric substrate of the connector of FIG. 10C.

In another configuration, a circuitized connector includes an electrical circuit to redistribute one or more signals from one lead of the electronic component to a number of leads of the other electronic component connected to the connector. FIGS. 10C and 10D illustrate a circuitized connector according to an alternate configuration of the present invention. Referring to FIGS. 10C and 10D, a circuitized connector 570 includes contact elements 572, 574, 576, 578 and 580. Instead of being connected to a terminal in vertical alignment to each contact element, connector 570 is circuitized so that a contact element formed on the top surface of the substrate may be connected to any one or more terminals formed on the bottom of the substrate. Specifically, the interconnection between the contact elements and the terminals can be realized using metal traces formed in an intermediate layer embedded within the connector substrate. In the present illustration, contact element 572 is connected to a terminal 582 directly below. However, contact element 574 is routed by metal trace 592 to be connected to terminal 588. Similarly, contact element 578 is routed by metal trace 594 to be connected to terminal 584. Finally, contact element 576 is connected to terminal 586 but also connected to contact element 580 and terminal 590 through metal trace 596. Thus, in accordance with the present invention, a connector of the present invention can be circuitized to connect one contact element to a terminal positioned anywhere on the opposite surface of the dielectric substrate. Furthermore, the connector of the present invention can be used to connect a contact element to a plural number of terminals so that any signal applied to the one contact element can be distributed to the plural number of terminals.

As described above, while FIGS. 9A, 9B, 10A and 10C illustrate circuitized connectors formed using the contact elements of the present invention, a circuitized LGA connector can be formed using other types of contact elements. The use of the contact elements of the present invention is illustrative only and is not intended to limit the connector of the present invention to include only contact elements of the present invention and described above.

According to another aspect of the present invention, an LGA connector incorporates embedded thermal dissipation structures to provide enhanced heat dissipation capability at specific contact elements. For instance, when a contact element engaging a lead of an electronic package carries more than 1 A of current, significant Joule heating can result creating a temperature rise of 20 degrees or more at the contact element. In accordance with the present invention, an LGA connector includes embedded thermal dissipation structures so as to effectively limit the temperature rise at specific contact elements. For example, the amount of temperature rise can be reduced to 10 degrees or less by the use of the embedded thermal dissipation structures in the connector of the present invention.

Figure 11:
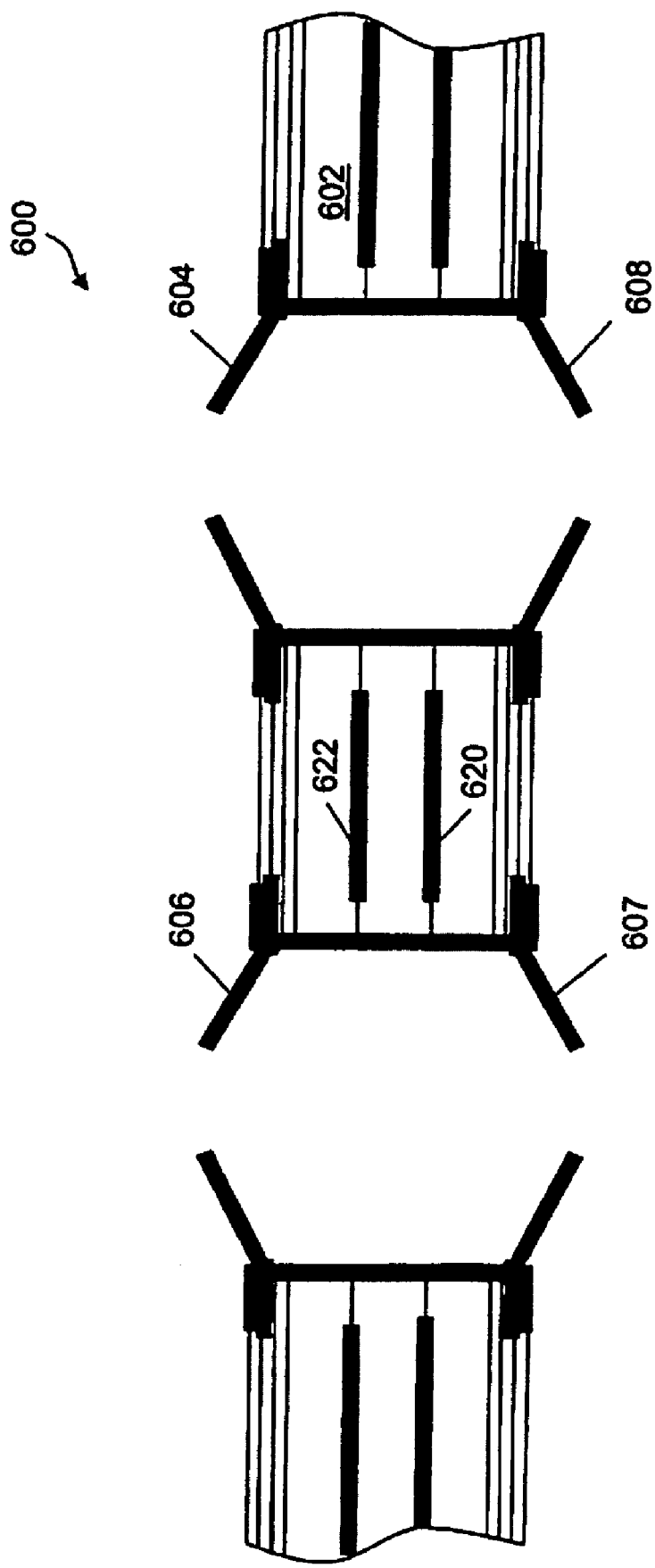
FIG. 11 illustrates a connector incorporating thermally conductive planes according to one configuration of the present invention.

FIG. 11 illustrates a connector incorporating thermally conductive planes according to one configuration of the present invention. Referring to FIG. 11, connector 600 includes contact elements 604 and 606 formed on the top surface of dielectric substrate 602. Thermally conductive planes 620 and 622 are formed in substrate 602 during the manufacturing process of substrate 602. Thermally conductive planes 620 and 622 provide heat dissipation function for contact elements 604, 608, 606 and 607. In one configuration, the thermally conductive planes are formed using Cu. In another configuration, the thermally conductive planes are formed using filled epoxy, which is not electrically conductive and be in intimate contact with the vias or contact elements without shorting the electrical paths.

Figure 12:
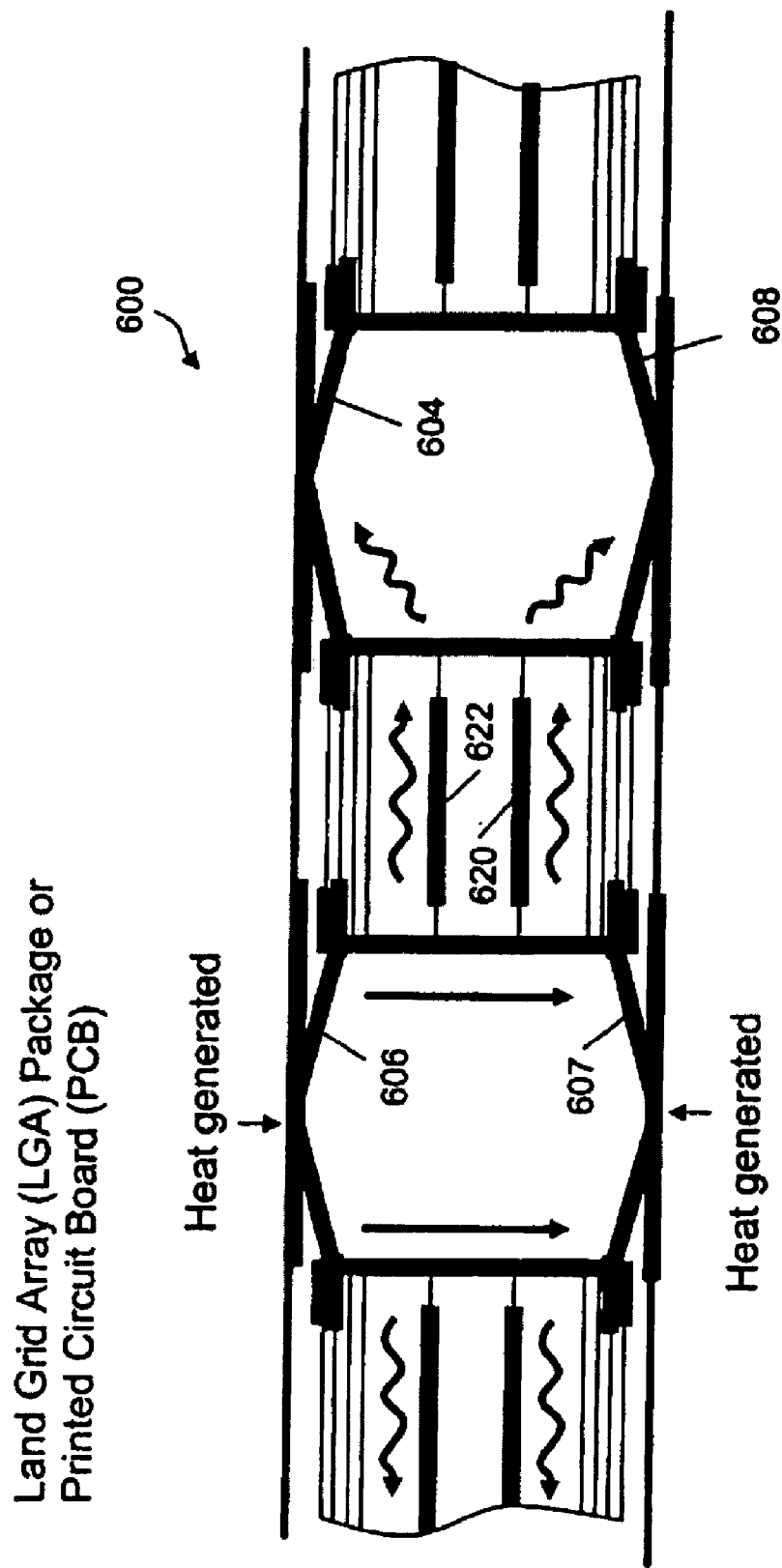
FIG. 12 illustrates the operation of the thermally conductive planes in the connector of FIG. 11.

FIG. 12 illustrates the operation of the thermally conductive planes in connector 600. Referring to FIG. 12, contact elements 606' and 607 are to be connected to pads of the LGA package and the PC board representing a high current connection. Thus, Joule heating at the pads occurs causing heat to be generated at the pads of the LGA package and the PC board. Thermally conductive planes 620 and 622 function to dissipate the heat away from contact elements 606 and 607. In the present illustration, the neighboring contact elements 604 and 608 are connected to a low current carrying signal. Thus, heat generated at contact elements 606 and 607 can be dissipated through thermally conductive planes 620 and 622 and through contact elements 604 and 608.

While the configuration described above and shown in FIG. 11 utilizes an LGA connector using the contact elements of the present invention, a LGA connector incorporating thermal dissipation structure can be formed using other types of contact elements. For example, the connector can be formed using metal springs and bundle wires. The use of the contact elements of the present invention in the LGA connector of FIG. 11 is illustrative only and is not intended to limit the connector of the present invention to include only contact elements of the present invention and described above.

According to yet another aspect of the present invention, a connector includes one or more coaxial contact elements. FIG. 13A is a cross-sectional view of a connector including a coaxial contact element according to one configuration of the present invention. FIG. 13B is a top view of the coaxial contact elements of FIG. 13A. Referring to FIG. 13A, connector 700 includes a first contact element 704 and a second contact element 706 formed on the top surface of a dielectric substrate. Contact elements 704 and 706 are formed in proximity to but electrical isolated from each other. In the present configuration, contact element 704 includes a base portion formed as an outer ring of aperture 703 while contact element 706 includes a base portion formed as an inner ring of aperture 703. Each of contact elements 704 and 706 includes three elastic portions (FIG. 13B). The elastic portions of contact element 704 do not overlap with the elastic portions of contact element 706. In the present configuration, contact element 704 is connected to a contact element 708 on the bottom surface of dielectric substrate 702 through a via 712. Contact elements 704 and 708 form a first current path, referred herein as the outer current path of connector 700. Furthermore, contact element 706 is connected to a contact element 709 on the bottom surface of dielectric substrate 702 through a metal trace formed in aperture 703. Contact elements 706 and 709 form a second current path, referred herein as the inner current path of connector 700.

Figure 14:
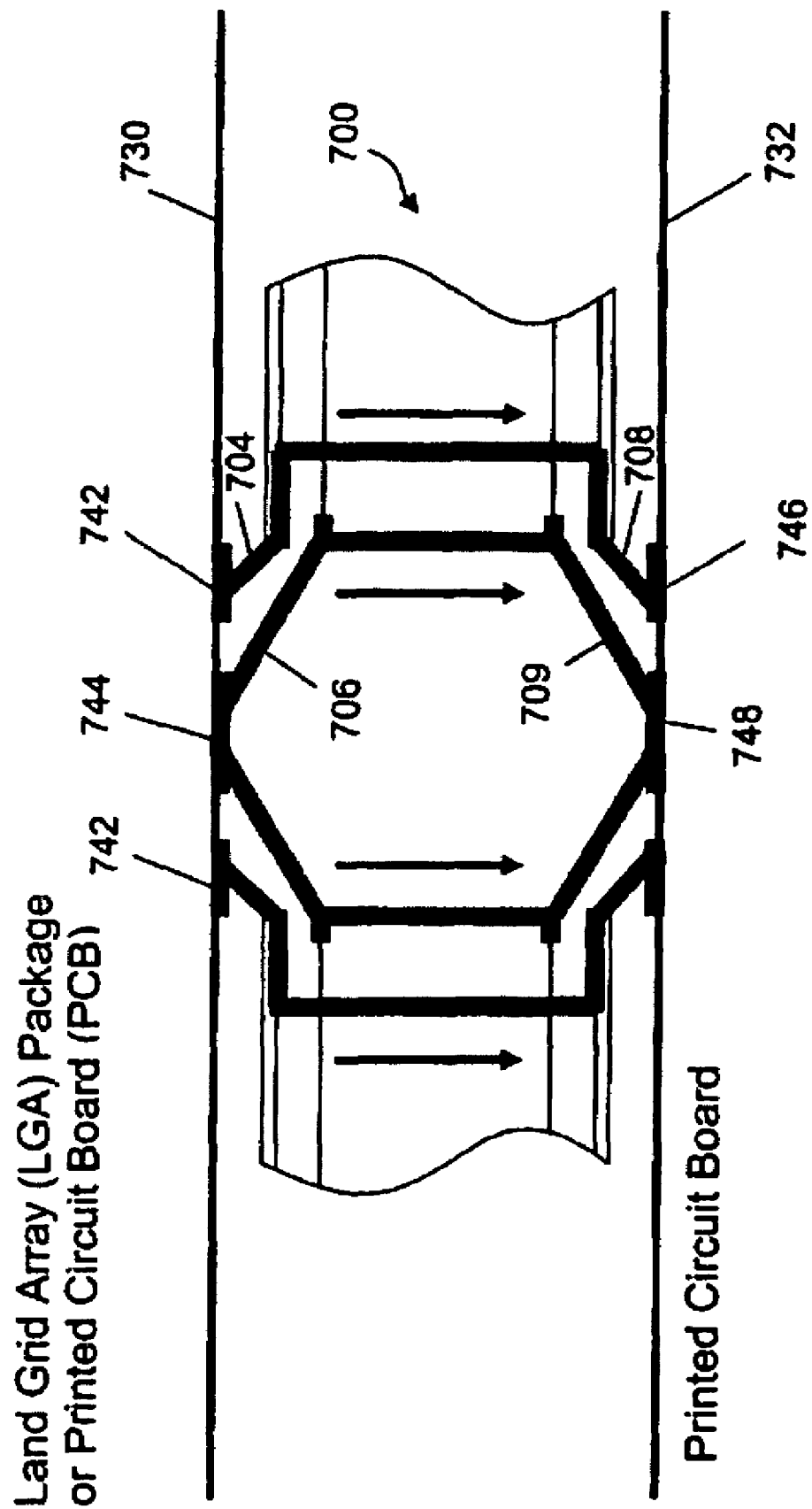
FIG. 14 illustrates the mating of an LGA package to a PC board through the connector of FIG. 13A.

As thus constructed, connector 700 can be used to interconnect a coaxial connection on a LGA package 730 to a coaxial connection on a PC board 732. FIG. 14 illustrates the mating of LGA package 730 to PC board 732 through connector 700. Referring to FIG. 14, when LGA package 730 is mounted to connector 700, contact element 704 engages a pad 742 on LGA package 730. Similarly, when PC board 732 is mounted to connector 700, contact element 708 engages a pad 746 on PC board 732. As a result, the outer current path between pad 742 and pad 746 is formed. Typically, the outer current path constitutes a ground potential connection. On the other hand, contact element 706 engages a pad 744 on LGA package 730 while contact element 709 engages a pad 748 on PC board 732. As a result, the inner current path between pad 744 and pad 748 is formed. Typically, the inner current path constitutes a high frequency signal.

A particular advantage of the connector of the present invention is that the coaxial contact elements can be scaled to dimensions of 1 mm or less. Thus, the connector of the present invention can be used to provide coaxial connection even for small geometry electronic components.

In the above description, the connector of the present invention is illustrated as being used to interconnect an LGA package to a PC board. This is illustrative only and in other configurations of the present invention, the connector can be used to interconnect two PC boards or two chip modules together. Basically, the connector of the present invention can be generally applied to connect the metal pads (lands) of an area array on an electronic component to the metal pads (lands) of an area array on another electronic component. In the case of the mating of two PC boards, the connector of the present invention provides particular advantages as PC boards are almost never coplanar. Because the connector of the present invention can be applied to accommodate a large coplanarity variation, such as on the order of 200 microns or more, with an insertion force of about 40 grams per contact or less, the connector of the present invention can be readily applied to make area array connections between two PC boards. Furthermore, the connector of the present invention is scalable in both pitch and height to less than 1 mm and is therefore suitable for use in small dimensional area array connections.

Moreover, in the above descriptions, various configurations of the connector are illustrated as including a first contact element on top and a second contact element on the bottom surface of the substrate. As discussed above, the use of a second contact element on the bottom surface of the substrate to serve as a terminal for the first contact element is illustrative only. The terminal can be formed as other types of electrical connection such as a solder ball or a pin.

According to yet another aspect of the present invention, a printed circuit board (PC board) incorporates an area array of LGA contact elements. Thus, an LGA package, an LGA module or another PC board with an area land grid array formed thereon can be attached to the PC board without the use of an interposer connector. By forming an area array of LGA contact elements, also referred to as a contact grid array, directly on a PC board, a compact and low profile integrated circuit assembly can be realized. Furthermore, the contact grid array provides separable or remountable interconnection for the LGA components to be mounted on the PC board. Thus, the benefit of a separable connection is retained even though a separate intermediate connector is eliminated.

In one configuration, the contact grid array can be formed using any conventional LGA interconnect technology. Typically, a contact element includes a conductive portion for engaging the pad of a land grid array. For example, the connector can include contact elements in the form of metal springs, bundled wires, metal in polymer, solid metal tabs, or any other electrical contact technology. Individual contact elements can be formed on the top surface of the dielectric substrate, such as by placing the contact elements directly on the top surface, or by embedding a portion of the contact element within the top surface, or by forming a portion of the contact element within an aperture on the top surface of the dielectric substrate. When metal springs and bundled wires are used as contact elements, the contact elements can be secured in their respective locations by compression force from the side walls (compression fit) or by adhesive or by soldering. Furthermore, the contact grid array can be formed using the contact element of the present invention as described above.

Figure 15:
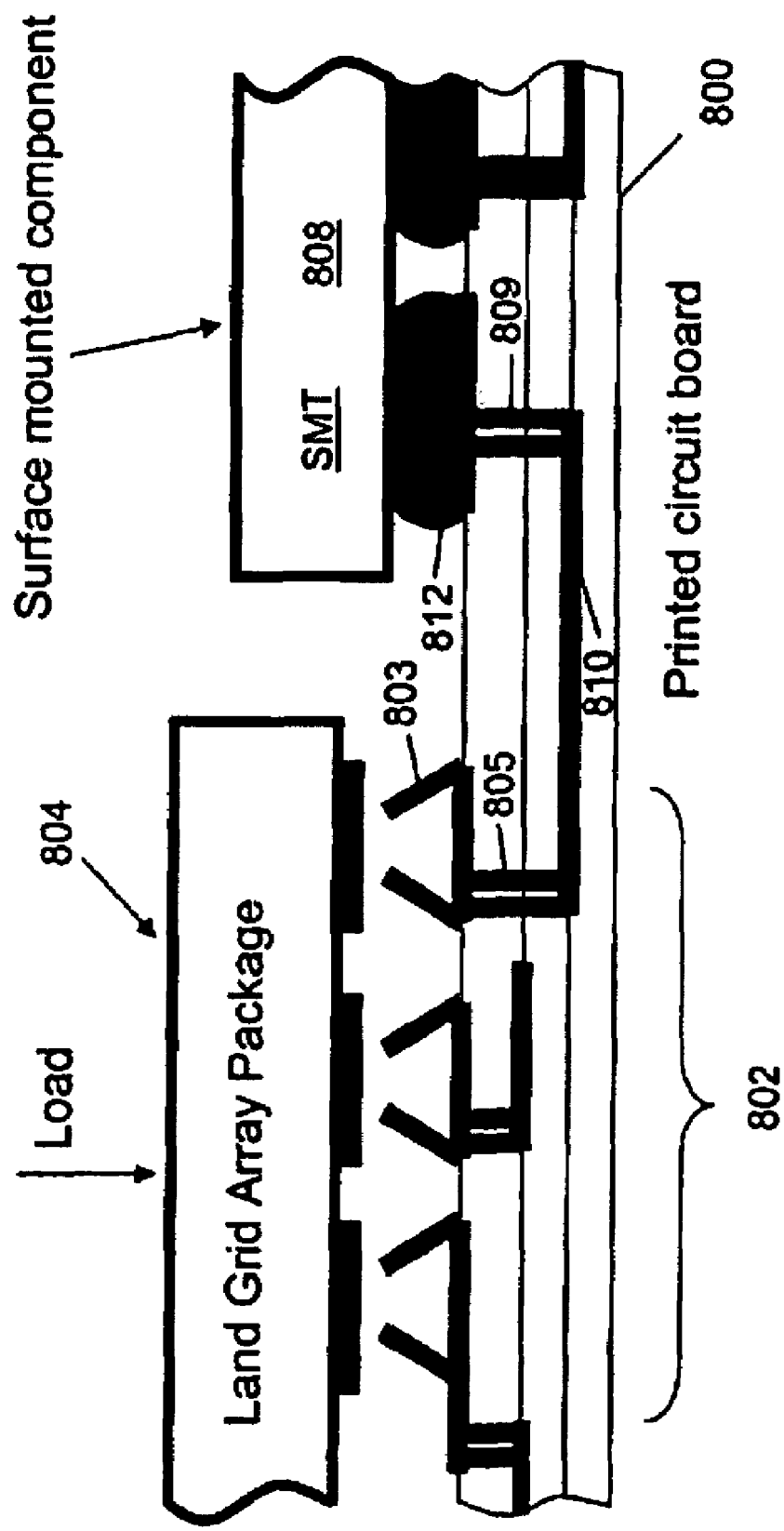
FIG. 15 is a cross-sectional view of a printed circuit board incorporating a contact grid array according to one configuration of the present invention.

FIG. 15 is a cross-sectional view of a printed circuit board incorporating a contact grid array according to one configuration of the present invention. Referring to FIG. 15, an array of contact elements 802, or a contact grid array 802, is integrated into a printed circuit board 800. The contact grid array 802 can be used to engage an LGA package or an LGA module without requiring the use of an LGA connector. Furthermore, individual contact elements can be coupled to the respective connection on printed circuit board 800 using conventional PCB technologies. For example, contact element 803 is connected to a solder bump lead 812 of a surface mounted component 808 through a via 805, a metal trace 810 and another via 809.

Contact grid array 802 formed on PC board 800 can be customized as described above to provide the desired operating properties. For example, the contact grid array can be formed to include contact elements having different operating properties, or the contact grid array can be circuitized to include electrical components, or the contact grid array can be formed to include thermally conductive planes. Finally; the contact grid array can also be formed to incorporate one or more coaxial contact elements.

Figure 16:
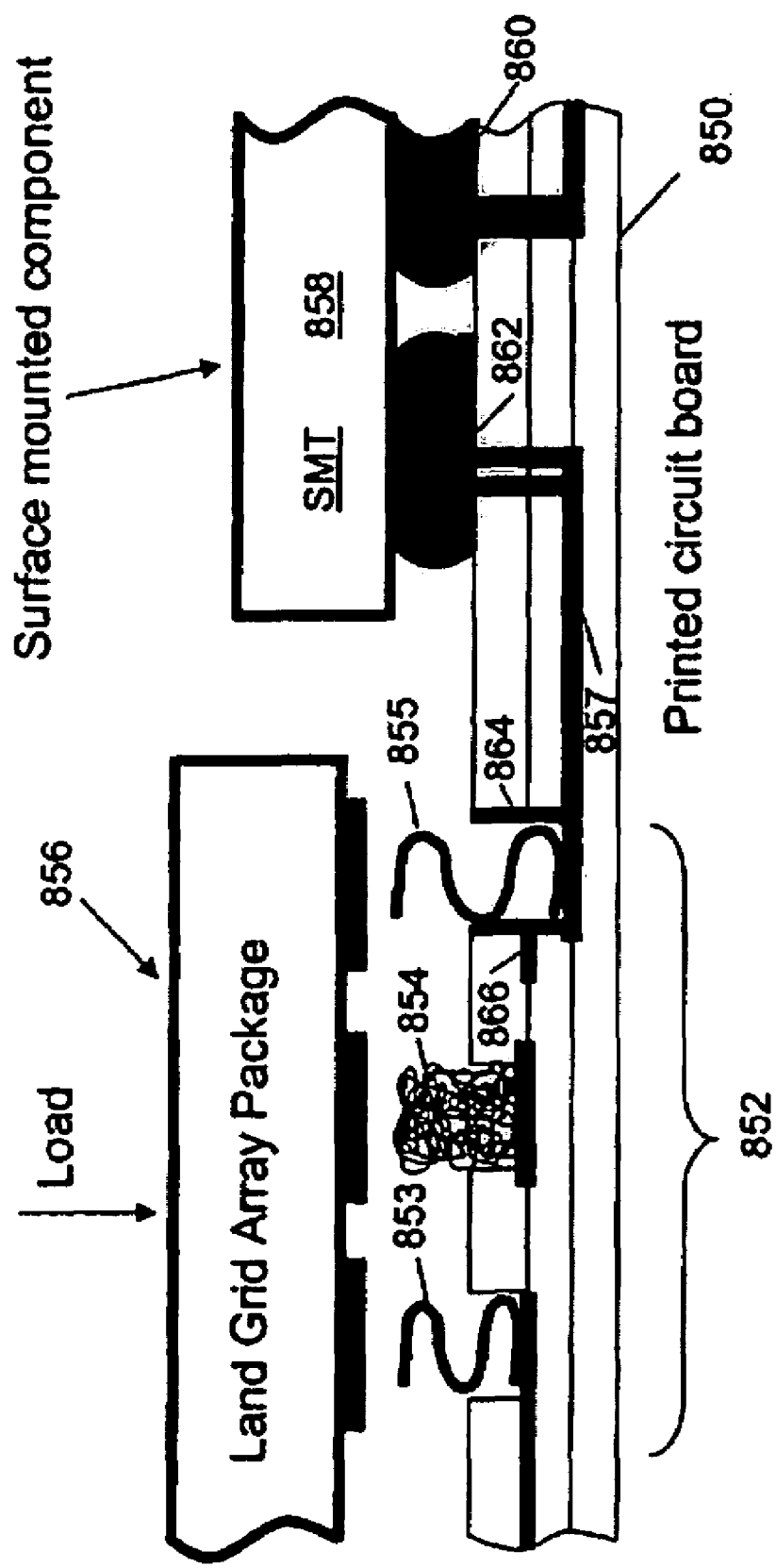
FIG. 16 is a cross-sectional view of a printed circuit board incorporating a contact grid array according to another embodiment of the present invention.

FIG. 16 is a cross-sectional view of a printed circuit board incorporating a contact grid array according to another configuration of the present invention. Referring to FIG. 16, a PC board 850 includes a contact grid array 852. In the present illustration, contact grid array 852 includes a contact element 852, formed using a metal spring, a contact element 854 formed using bundled wire, and a contact element 855 formed using a metal spring. Contact grid array 852 can be used to connect to LGA package 856. Furthermore, contact grid array 852 provides a separable or remountable connection whereby LGA package 856 can be removed and remated. FIG. 16 illustrates that the contact grid array of the present invention can be formed using other types of contact elements and also using a variety of contact elements. That is, contact grid array 852 does not have to be formed using the same type of contact elements. Furthermore, in addition to making electrical contact to the printed circuit board at the bottom of the contact element, the contact elements can make electrical contact with metallized sidewalls 864 in the circuit board. These sidewalls can be used to route electrical current to different layers in the circuit board 866.

Incorporating a contact grid array in a PC board in accordance with the present invention provides many advantages. First, individual contact elements can be circuitized so that conductive traces for each contact element can be formed in different layers of the PC board, enabling high degree of integration. For example, as shown in FIG. 16, contact element 855 is formed deeper in PC board 850 and connects to a metal trace 857. Through metal trace 857, contact element 855 is connected to a lead of a surface mount component 858. In the present illustration, surface mount component 858 is a ball grid array and is attached to pads 860 and 862 of PC board 850. Second, the overall electrical path length can be reduced by removing the interposer. Reducing the overall electrical path length generally reduces resistance and inductance, and improves signal integrity. Similarly, the overall cost can be reduced by removing the interposer and reducing the number of components. The contact elements can be reworked individually during assembly, if required, such that a single poor contact element does not require the replacement of the entire array. Furthermore, the profile of the connector can be reduced to allow the mounted LGA component to lie closer to the surface of the printed circuit board. This is particularly advantageous in mobile applications and other applications in which there are restrictions on the overall system height.

The above detailed descriptions are provided to illustrate specific configurations of the present invention and are not intended to be limiting. Numerous modifications and variations within the scope of the present invention are possible.

According to alternate configurations of the present invention, the following mechanical properties can be specifically engineered for a contact element or a set of contact elements to achieve certain desired operational characteristics. First, the contact force for each contact element can be selected to ensure either a low resistance connection for some contact elements or a low overall contact force for the connector. Second, the elastic working range of each contact element over which the contact element operates as required electrically can be varied between contact elements. Third, the vertical height of each contact element can be varied, such as for accommodating coplanarity variations. Fourth, the pitch or horizontal dimensions of the contact element can be varied.

According to alternate configurations of the present invention, the electrical properties can be specifically engineered for a contact element or a set of contact elements to achieve certain desired operational characteristics. For instance, the DC resistance, the impedance, the inductance and the current carrying capacity of each contact element can be varied between contact elements. Thus, a group of contact elements can be engineered to have lower resistance or a group of contact elements can be engineered to have low inductance.

In most applications, the contact elements can be engineered to obtain the desired reliability properties for a contact element or a set of contact elements to achieve certain desired operational characteristics. For instance, the contact elements can be engineered to display no or minimal performance degradation after environmental stresses such as thermal cycling, thermal shock and vibration, corrosion testing, and humidity testing. The contact elements can also be engineering to meet other reliability requirements defined by industry standards, such as those defined by the Electronics Industry Alliance (EIA).

When the contact elements in accordance with the present invention are used to form the LGA connector, the mechanical and electrical properties of the contact elements can be modified by changing the following design parameters. First, the thickness of the elastic portion, such as the flanges, can be selected to give a desired contact force. For example, a flange thickness of about 40 microns typically gives low contact force on the order of 20 grams or less while a flange thickness of 80 microns gives a much higher contact force of over 100 grams for the same displacement. The width, length and shape of the elastic portion can also be selected to give the desired contact force.

Second, the number of elastic portions to include in a contact member can be selected to achieve the desired contact force, the desired current carrying capacity and the desired contact resistance. For example, doubling the number of flanges roughly doubles the contact force and current carrying capacity while roughly decreasing the contact resistance by a factor of two.

Third, specific metal composition and treatment can be selected to obtain the desired elastic and conductivity characteristics. For example, Cu-alloys, such as copper-beryllium, can be used to provide a good tradeoff between mechanical elasticity and electrical conductivity. Alternately, metal multi-layers can be used to provide both excellent mechanical and electrical properties. In one configuration, a stainless steel flange is coated with copper (Cu) and then nickel (Ni) and finally gold (Au) to form a stainless steel/Cu/Ni/Au multilayer. The stainless steel will provide excellent elasticity and high mechanical durability while the Cu provides excellent conductivity and the Ni and Au layers provide excellent corrosion resistance. Finally, cold working, alloying, annealing, and other metallurgical techniques can be used to engineer the specific desired properties of the elastic portion.

Fourth, the bend shape of the elastic portion can be designed to give certain electrical and mechanical properties. The height of the elastic portion, or the amount of protrusion from the base portion, can also be varied to give the desired electrical and mechanical properties.

The foregoing disclosure of configurations of the present invention has been presented for purposes of illustration and description. It is not intended to be exhaustive or to limit the invention to the precise forms disclosed. Many variations and modifications of the configurations described herein will be apparent to one of ordinary skill in the art in light of the above disclosure. The scope of the invention is to be defined only by the claims appended hereto, and by their equivalents.

Further, in describing representative configurations of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An elastic contact array printed circuit board comprising:
    a dielectric substrate having one or more electrical traces;
    an array of three dimensional elastic metallic contacts formed on the substrate, one or more of the contacts comprising an integral base portion and only one elastic arm, with an elongated metallic grain dimension oriented toward the longitudinal direction of the arm;
    the base portion of the contact adhered directly to the substrate;
    the base of a contact electrically connected to a trace;
    singulated contacts; and
    an electrical insulation of at least one trace.

2. An elastic contact array printed circuit board of claim 1 further comprising a unitary contact and electrical trace formed by masking, etching and forming a conductive surface on the substrate.

3. An elastic contact array printed circuit board of claim 1 further comprising an intermetallic bond between the contact base and electrical trace.

4. The elastic contact array printed circuit board of claim 1 further comprising an electronic component on the circuitized substrate.

5. The elastic contact array printed circuit board of claim 1 further comprising a unitary elastic contact and trace formed by an intermetallic bond at the contact base and trace.

6. The elastic contact array printed circuit board of claim 1 further comprising a flexible substrate.

7. The contact array of claim 1 wherein the only one arm of the one or more contacts is a cantilevered arm.

8. A circuitized substrate having one or more electrical traces comprising:
    an array of three dimensional elastic contacts joined to the traces of the circuitized substrate, one or more contacts in the array are singulated and comprise a base portion and one elastic arm which is free at its distal end, with an elongated metallic grain dimension oriented toward the longitudinal direction of the arm; and
    an insulating substrate covering said traces.

9. A circuitized substrate of claim 8 further comprising a unitary contact and electrical trace.

10. A circuitized substrate of claim 8 further comprising an intermetallic bond between the contact base and electrical trace.

11. The circuitized substrate of claim 8 further comprising an electronic component on the circuitized substrate.

12. The circuitized substrate of claim 8 further comprising a unitary elastic contact and trace formed by an intermetallic bond at the contact base and trace.

13. The circuitized substrate of claim 8 further comprising a flexible substrate.

14. An elastic contact array on a substrate comprising:
   electrical circuits and traces electrically connected to the circuits on the substrate;
   an array of three dimensional metallic elastic contacts within a spring sheet;
   the spring sheet containing the array of three dimensional contacts joined to the substrate having electrical traces, the contacts having a base and a single arm, with an elongated metallic grain dimension oriented toward the longitudinal direction of the arm;
   the elastic contacts base electrically connected to corresponding electrical traces;
   singulated contacts; and.
   one or more additional substrates each with circuits and electrical traces connected to the circuits connecting one or more circuits on one or more of the substrates selectively with one or more elastic contacts.

15. An elastic contact array on a substrate of clam 14 further comprising contacts on multiple substrates.

16. An elastic contact array printed circuit board comprising:
   a substrate having electrical circuits and one or more electrical traces connected to one or more electrical circuits;
   an array of three dimensional elastic contacts formed on the substrate, the contacts comprising a base portion and an elastic arm with an elongated metallic grain dimension oriented toward the longitudinal direction of the contact arm;
   the base of a contact electrically connected to a trace of the substrate;
   singulated contacts; and
   an electrical insulation of at least one trace.

17. The circuitized substrate of claim 16 further comprising one or more traces formed as coaxial electrical connectors.

18. A circuitized substrate having one or more electrical traces, comprising:
   an array of three dimensional elastic contacts joined to the traces of the circuitized substrate, one or more contacts in the array are singulated and comprise a base portion and an elastic arm with an elongated metallic grain dimension oriented toward the longitudinal direction of the contact arm; and
   an insulating substrate covering said traces.

* * * * *